(12) United States Patent
Yan et al.

(10) Patent No.: US 8,918,743 B1
(45) Date of Patent: Dec. 23, 2014

(54) EDGE-BASED FULL CHIP MASK TOPOGRAPHY MODELING

(71) Applicant: Synopsys, Inc., Mountain View, CA (US)

(72) Inventors: Qiliang Yan, Portland, OR (US); Hongbo Zhang, Beaverton, OR (US); Ebo Croffie, Portland, OR (US); Lin Zhang, Fremont, CA (US); Yongfa Fan, Sunnyvale, CA (US); Peter Brooker, Georgetown, TX (US); Qian Ren, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/965,111

(22) Filed: Aug. 12, 2013

(51) Int. Cl.
*G06F 17/50* (2006.01)
(52) U.S. Cl.
CPC .................................. *G06F 17/5081* (2013.01)
USPC ............................................................ 716/51
(58) Field of Classification Search
CPC .................................. G06F 1/144; G06F 1/36
USPC ............................................................ 716/51
See application file for complete search history.

(56) References Cited

U.S. PATENT DOCUMENTS

| | | | |
|---|---|---|---|
| 7,703,069 B1* | 4/2010 | Liu et al. | 716/50 |
| 8,352,885 B2 | 1/2013 | Liu et al. | |
| 2010/0162199 A1* | 6/2010 | Liu et al. | 716/21 |
| 2013/0139118 A1* | 5/2013 | Liu et al. | 716/53 |

OTHER PUBLICATIONS

Huang, Hsu-Ting, et al, "Full-chip OPC and verification with a fast mask 3D model," Proc. of SPIE vol. 7973, Mar. 22, 2011, 9 pages.
Liu, Peng, et al, "A full-chip 3D computational lithography framework," Proc. of SPIE vol. 8326, Feb. 21, 2012, 18 pages.
Liu, Peng, "Accurate prediction of 3D mask topography induced best focus variation in full-chip photolithography applications," Proc. of SPIE vol. 8166, Oct. 13, 2011, 8 pages.

* cited by examiner

*Primary Examiner* — Suresh Memula
(74) *Attorney, Agent, or Firm* — HIPLegal LLP; Judith A. Szepesi

(57) ABSTRACT

A method and apparatus of a novel full chip edge-based mask three-dimensional (3D) model for performing photolithography simulation is described. The method applies a thin mask model to a mask design layout to create a thin mask transmission. The method generates a thick mask model that has a plurality of edge-based kernels. The method applies the thick mask model to the mask design layout to create a mask 3D residual. The method combines the thin mask transmission and the mask 3D residual to create a mask 3D transmission.

25 Claims, 23 Drawing Sheets

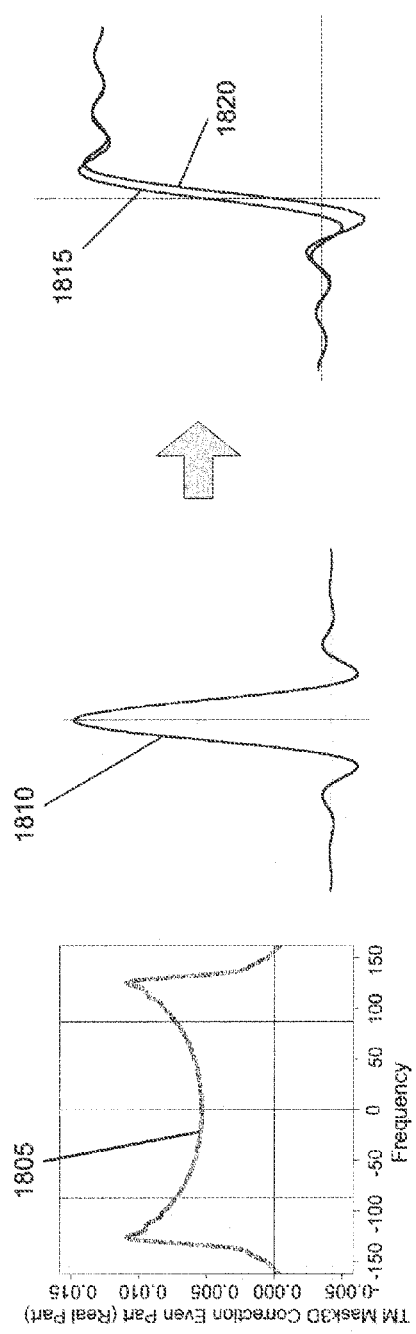
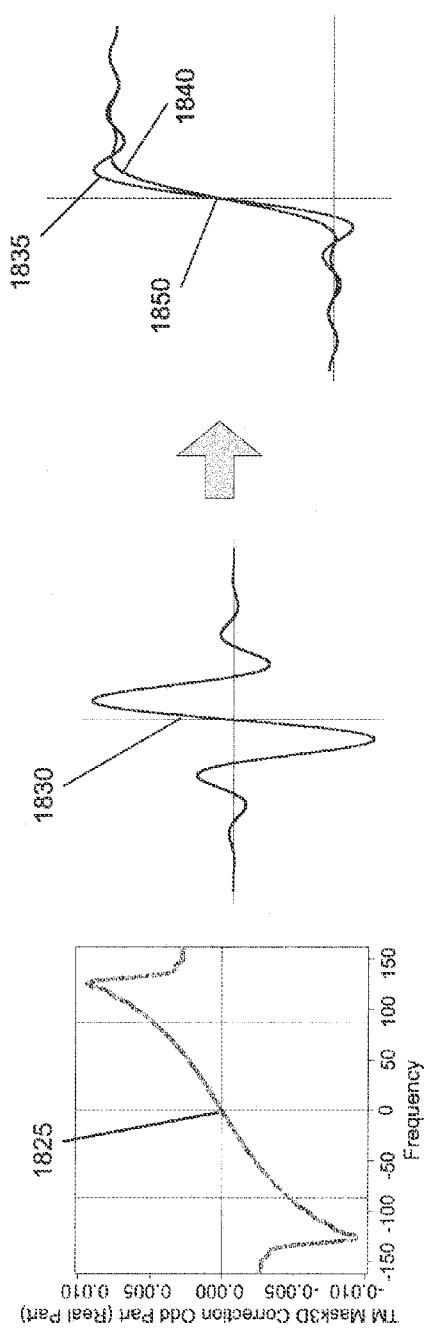
FIG. 18A
FIG. 18B

EDGE-BASED FULL CHIP MASK TOPOGRAPHY MODELING

FIELD

The present invention relates to electronic design automation and in particular to simulating photolithography processes.

BACKGROUND

Photolithography is a process used in microfabrication to pattern the bulk of a substrate. It uses light to transfer a geometric pattern from an optical mask to a light-sensitive chemical "photoresist", or simply "resist," on the substrate. The pattern in the resist is created by exposing it to light with a projected image using an optical mask.

Optical proximity correction (OPC) is a photolithography enhancement technique commonly used to compensate for image errors due to diffraction or process effects. OPC corrects image errors by moving edges or adding extra polygons to the pattern written on the optical mask. Model based OPC uses compact models to dynamically simulate the final pattern and thereby derive the movement of edges, typically broken into sections, to find the best solution. The objective is to reproduce, as well as possible, the original layout drawn by the designer in the silicon wafer.

The cost of manufacturing advanced mask sets is steadily increasing as technology becomes more and more complex. In addition, the turn-around time is always an important consideration in semiconductor manufacturing. As a result, computer simulations of the photolithography process, which assist in reducing both the cost and turn-around time, have become an integral part of semiconductor manufacturing.

One of the most important inputs to any photolithography simulation system is the model for the interaction between the illuminating electric field and the mask. Conventionally, the thin mask approximation is used in most photolithography simulation systems. The thin mask approximation, also called the Kirchhoff boundary condition or mask two-dimensional (2D), assumes that the thickness of the structures on the mask is very small compared with the wavelength and that the widths of the structures on the mask are very large compared with the wavelength. Therefore, the thin mask model provides reasonably accurate calculations for feature sizes much larger than the exposure wavelength.

As semiconductor feature sizes continue to shrink further below the exposure wavelength, mask topography effect, also called thick mask effect or mask three-dimensional (3D), is a considerable factor to impact the photolithography modeling and full chip OPC process. The mask topography effect includes polarization dependence due to the different boundary conditions for the electric and magnetic fields, transmission and phase error in small openings, edge diffraction (or scattering) effects or electromagnetic coupling.

The thin mask approximation is not accurate enough in simulating mask topography effect. FIG. 1A illustrates a mask image simulated by using thin mask model. Specifically, this figure shows light 110 passes through an optical mask 105. The resulting mask image, as simulated by the thin mask model, is pattern 115.

In optical reflection, the plane of incidence is the plane spanned by the surface normal and the propagation vector of the incoming radiation. The component of the electric field parallel to the plane of incidence is termed p-like (parallel) and the component perpendicular to the plane of incidence is termed s-like. Light with a p-like electric field is said to be a transverse-magnetic (TM) wave. Light with an s-like electric field is called a transverse-electric (TE) wave.

FIG. 1B illustrates mask images rigorously simulated by using thick mask model that takes mask topography effect into consideration. Specifically, this figure shows light is decomposed into TE wave 120 and TM wave 125. The TE wave 120 and TM wave 125 pass through the optical mask 105. The resulting mask images, as rigorously simulated by the thick mask model, are patterns 130 and 135, respectively. As illustrated in FIG. 1B, both the patterns 130 and 135 have wave perturbations 150 and 155 respectively, due to the mask topography effect. The wave perturbations 150 and 155 cannot be accurately simulated by using the thin mask model described in FIG. 1A above.

Among different types of modeling schemes for tackling mask topography effect, rigorous simulation is usually considered to be accurate. But rigorous simulation runs extremely slowly, making it impractical for full chip level implementation. Instead, application of rigorous simulation is limited to small areas of a chip design layout. The prior art of the compact modeling schemes with domain decomposition and boundary layer definition lack real physical meaning and rely on intensive model fitting. Consequently, conventional compact modeling schemes cannot accurately simulate the mask topography effect. Furthermore, conventional compact modeling schemes lack flexibility for dealing with all-angle patterns.

Edge coupling effect is the mask near-field interaction among adjacent edges. In photolithography simulation, strong edge coupling effect will be generated when feature size and space are small. Prior art photolithography simulation schemes do not address edge coupling effect with both accuracy and runtime efficiency.

Off-axis illumination (OAI) is an optical system setup in which the incoming light strikes the optical mask at an oblique angle rather than perpendicularly. OAI brings additional complication to the photolithography simulation of mask topography effect.

BRIEF DESCRIPTION OF THE FIGURES

The present invention is illustrated by way of example, and not by way of limitation, in the figures of the accompanying drawings and in which like reference numerals refer to similar elements and in which:

FIG. 18A conceptually illustrates an example of shadowing effect.

FIG. 18B conceptually illustrates an example of blurring effect.

DETAILED DESCRIPTION

A novel full chip edge-based mask 3D model for performing photolithography simulation is described. The edge-based mask 3D model intrinsically relies on the real physical mask 3D behavior decomposition based on empirical data or rigorous modeling simulation. Instead of straightforward kernel fitting with empirical data as what conventional work has done, the present invention adopts a novel modeling process from rigorous simulation to decompose the real physical response into edge-based modeling component. Thus a compact model can be achieved for full chip simulation and OPC process. The understanding of the true physical behavior of the mask 3D has strong prediction power and high runtime efficiency for various types of one-dimensional and 2D patterns.

In an exemplary embodiment, a method and apparatus receives a mask design layout. The method applies thin mask model to the mask design layout to create a thin mask transmission. The method applies thick mask model to the mask design layout to create a mask 3D residual. The method combines the thin mask transmission and the mask 3D residual to create a mask 3D transmission. The method simulates aerial image of the mask design layout using mask 3D transmission and optical model. The method simulates resist patterns with aerial image and resist model.

To generate the thick mask model, in one embodiment, the method receives a mask topography structure. The method performs a rigorous simulation to simulate a near-field of mask topography effect. The method subtracts a thin mask electric field from the near-field to obtain a reference mask 3D residual. The method decomposes the reference mask 3D residual to derive edge-based kernels for TE (transverse electric) polarization and TM (transverse magnetic) polarization.

To apply the thick mask model, in one embodiment, the method retrieves edge-based kernels for TE polarization and TM polarization. The method applies a rasterization filter to the edge-based kernels. The method then applies the filtered kernels to edges in the mask design layout to produce a mask 3D residual.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1A:
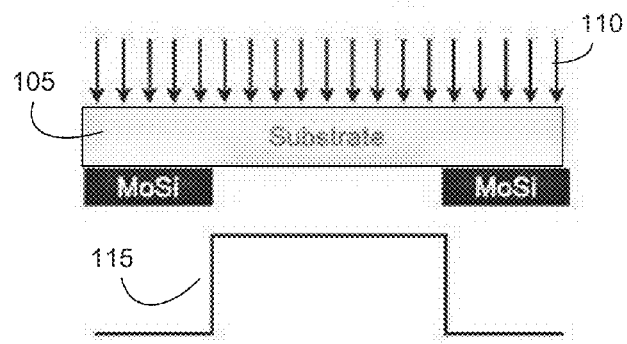
FIG. 1A illustrates a mask image simulated by using thin mask model.
Figure 1B:
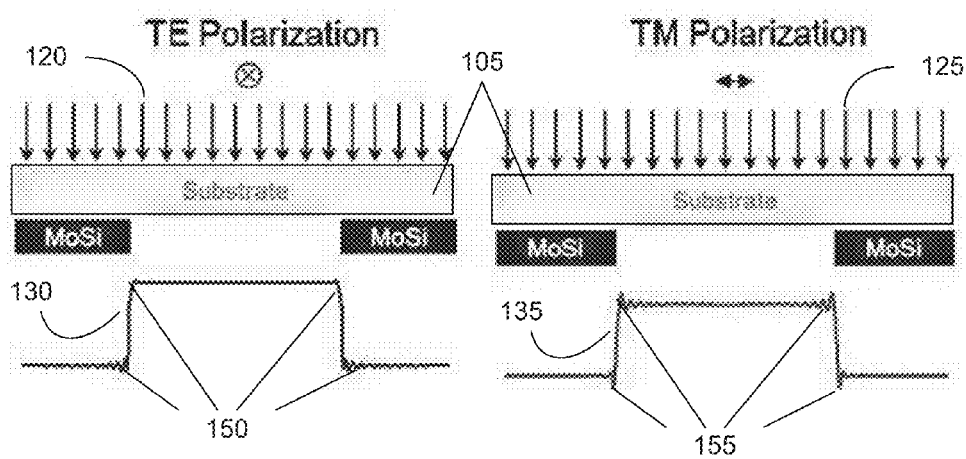
FIG. 1B illustrates mask images rigorously simulated by using thick mask model that takes mask topography effect into consideration.
Figure 2:
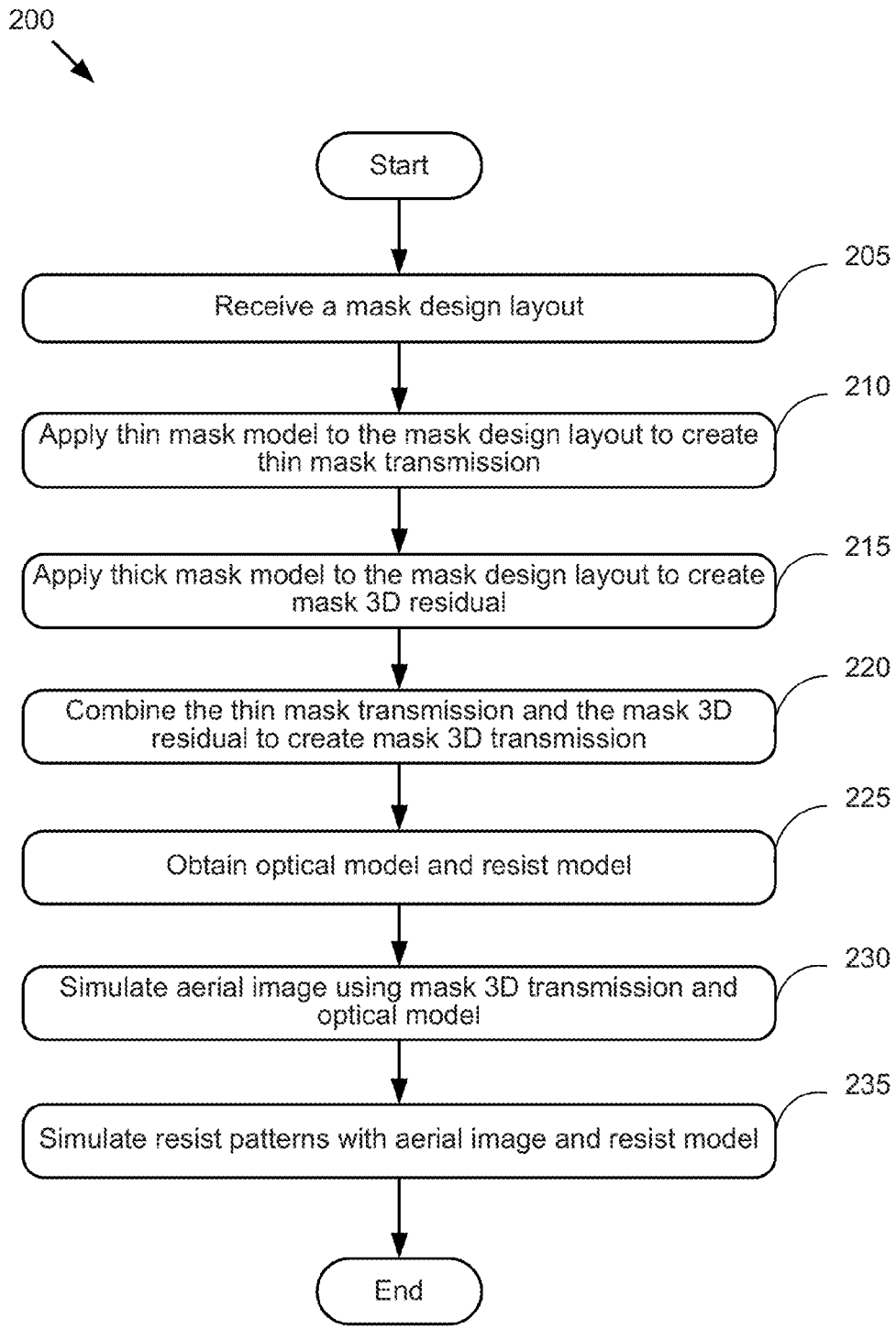
FIG. 2 is an overview flowchart of one embodiment of using edge-based mask 3D model to perform photolithography simulation.

FIG. 2 is an overview flowchart of one embodiment of using edge-based mask 3D model to perform photolithography simulation. Specifically, this figure describes a process 200 that performs photolithography simulation by using the combination of a thin mask transmission and a mask 3D residual to form a mask 3D transmission. In one embodiment, the process 200 starts when a design layout of an optical mask needs to be verified to see if it can produce the desired wafer pattern. As shown in the figure, the process 200 begins by receiving, at block 205, a mask design layout. In one embodiment, the mask design layout is in the form of a polygon-based hierarchical data file in the GDS (Graphic Database System) or OASIS.MASK format.

At block 210, the process 200 applies thin mask model to the mask design layout to create a thin mask transmission. The process 200, at block 215, applies thick mask model to the mask design layout to create a mask 3D residual. The thick mask model and the creation of the mask 3D residual will be further described in FIGS. 3-9.

The process 200, at block 220, combines the thin mask transmission and the mask 3D residual to create a mask 3D transmission. At block 225, the process 200 obtains an optical model and a resist model.

The optical model simulates the projection and image forming process in the exposure tool. The optical model incorporates critical parameters of the illumination and projection system. In one embodiment, these parameters of the illumination and project system include numerical aperture and partial coherence settings, illumination wavelength, illuminator source shape, and possibly imperfections of the system such as aberrations or flare.

The resist model helps to predict shapes and sizes of structures formed on a substrate. In one embodiment, the resist model is used to simulate the effect of projected light interacting with the photosensitive resist layer and the subsequent post-exposure bake (PEB) and development process.

Next, the process 200 simulates, at block 230, aerial image using the mask 3D transmission and the optical model. At block 235, the process 200 simulates resist patterns on the wafer with the simulated aerial image and the resist model. The process 200 then ends.

One of ordinary skill in the art will recognize that the process 200 is a conceptual representation of the operations used to perform photolithography simulation. The specific operations of the process 200 may not be performed in the exact order shown and described. For example, blocks 210 and 215 are not dependent on each other, and therefore can be performed in reverse order or in parallel. The specific operations may not be performed in one continuous series of operations, and different specific operations may be performed in different embodiments. Furthermore, the process could be implemented using several sub-processes, or as part of a larger macro process. For instance, in some embodiments, the process 200 is performed by one or more software applications that execute on one or more computers.

Figure 3:
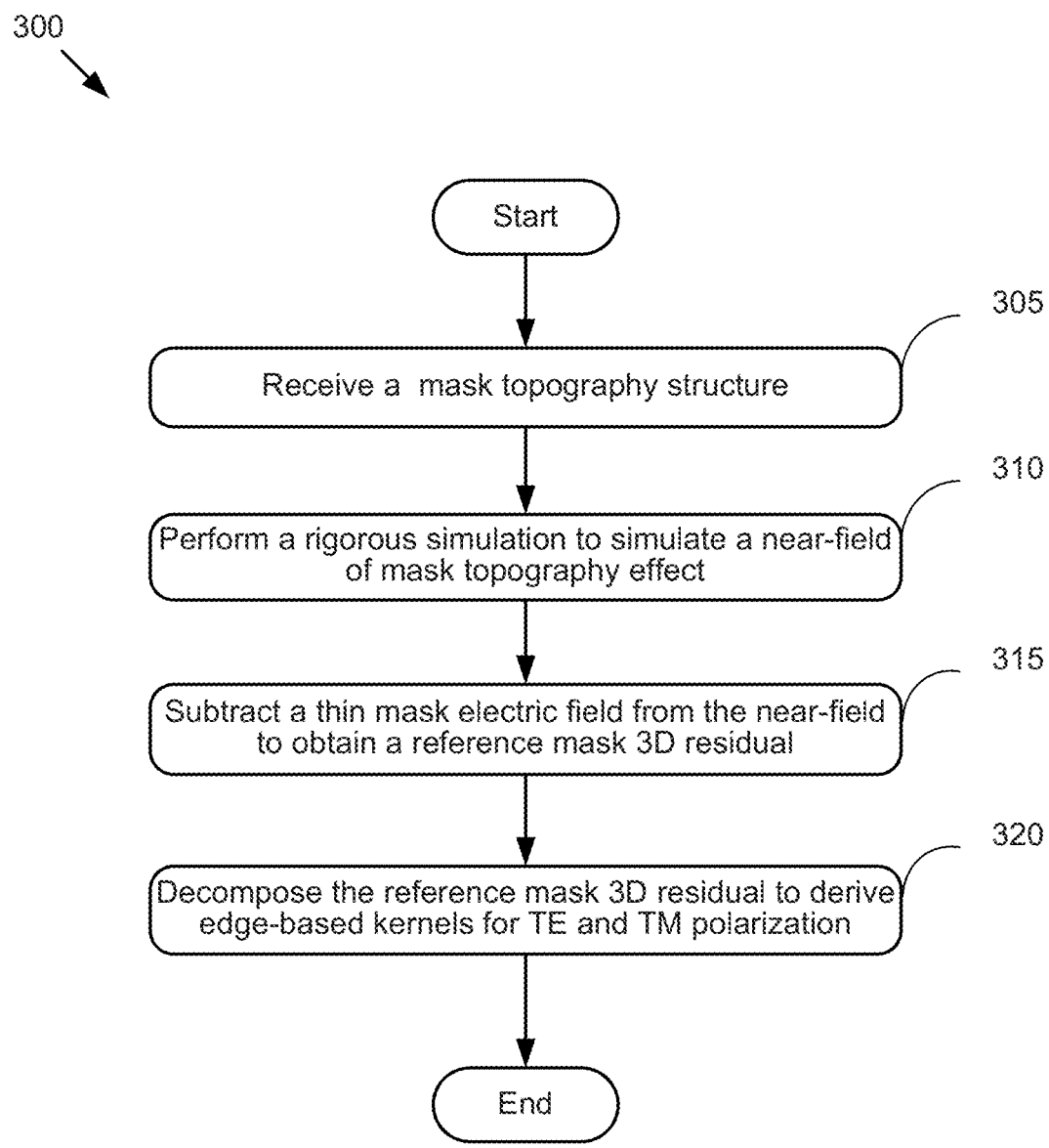
FIG. 3 is a flowchart of one embodiment of generating the thick mask model.

FIG. 3 is a flowchart of one embodiment of generating the thick mask model. Specifically, this figure describes a process 300 that generates edge-based kernels of the thick mask model. A kernel is a function that can be applied to an image through convolution in order to generate certain effects. Edge-based kernels are kernels that are extracted based on the physical attributes of edges. In one embodiment, the process 300 starts when a thick mask model is needed to accurately simulate the mask topography effect. For example, the process 300 is performed before the execution of block 215 described in FIG. 2 above. As shown in the figure, the process 300 begins by receiving, at block 305, a mask topography structure. The mask topography structure is the physical 3D structure of the real mask that could distort the near-field image of mask from the ideal thin mask model. In one embodiment, the mask topography structure is a combination of all the factors, including material, geometry setting and process variations, in mask making and implementations.

At block 310, the process 300 performs a rigorous simulation to simulate a near-field of the mask topography effect. At block 315, the process 300 subtracts a thin mask electric field from the near-field to obtain a reference mask 3D residual. In one embodiment, the thin mask electric field can be gained with a rasterization with foreground and background transmission.

The process 300, at block 320, decomposes the reference mask 3D residual to derive edge-based kernels for TE polarization and TM polarization. The reference mask 3D residual and the edge-based kernels will be further described in FIG. 5 below. The process 300 then ends.

One of ordinary skill in the art will recognize that the process 300 is a conceptual representation of the operations used to generate the thick mask model. The specific operations of the process 300 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 300 is performed by one or more software applications that execute on one or more computers.

Figure 4:
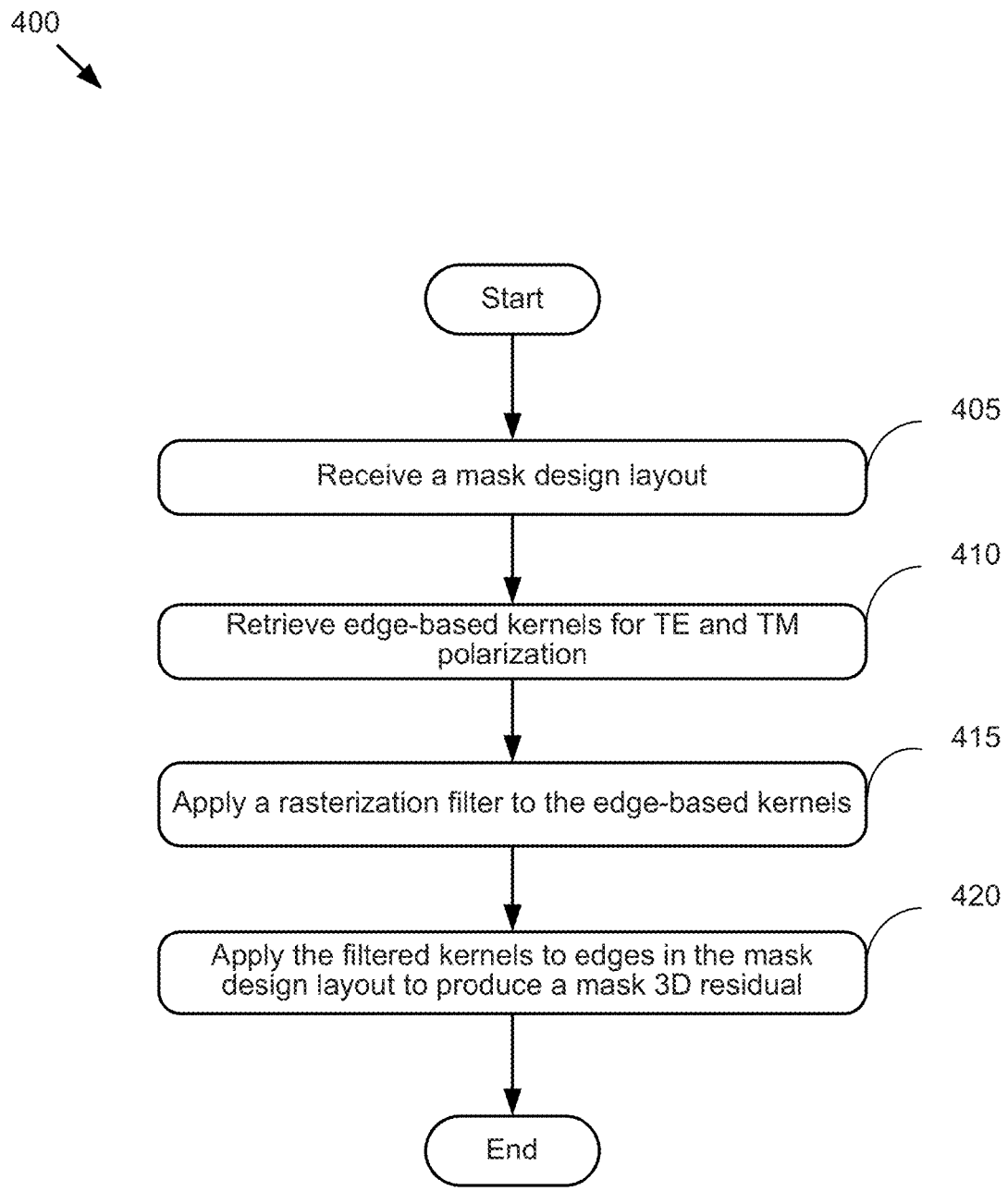
FIG. 4 is a flowchart of one embodiment of applying thick mask model to a mask design layout.

FIG. 4 is a flowchart of one embodiment of applying thick mask model to a mask design layout. Specifically, this figure describes a process 400 that applies edge-based kernels of the thick mask model. In one embodiment, the process 400 starts after a thick mask model has been generated, e.g., by the process described in FIG. 3 above. In one embodiment, the process 400 corresponds to block 215 described in FIG. 2 above. As shown in the figure, the process 400 begins by receiving, at block 405, a mask design layout. In one embodiment, the mask design layout is in the form of a polygon-based hierarchical data file in the GDS (Graphic Database System) or OASIS.MASK format.

At block 410, the process 400 retrieves edge-based kernels for TE polarization and TM polarization. In one embodiment, the edge-based kernels are generated by the process described in FIG. 3 above.

The process 400, at block 415, applies a rasterization filter to the edge-based kernels. In one embodiment, the preferred rasterization filter has the following criteria: maintaining high fidelity within optical bandwidth; attenuating the frequencies beyond mirror point of the optical bandwidth; having small spatial-domain ambit (e.g., no greater than 0.14 µm), and desired angular symmetry. In one embodiment, Fourier-Bessel orthogonal basis functions are used as the rasterization filter. One embodiment of the rasterization filter will be further described in FIG. 8 below.

At block 420, the process 400 applies the filtered kernels to edges in the mask design layout to produce a mask 3D residual. The mask 3D residual will be further described in FIG. 9 below. The process 400 then ends.

One of ordinary skill in the art will recognize that the process 400 is a conceptual representation of the operations used to apply the thick mask model. The specific operations of the process 400 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 400 is performed by one or more software applications that execute on one or more computers.

Figure 5:
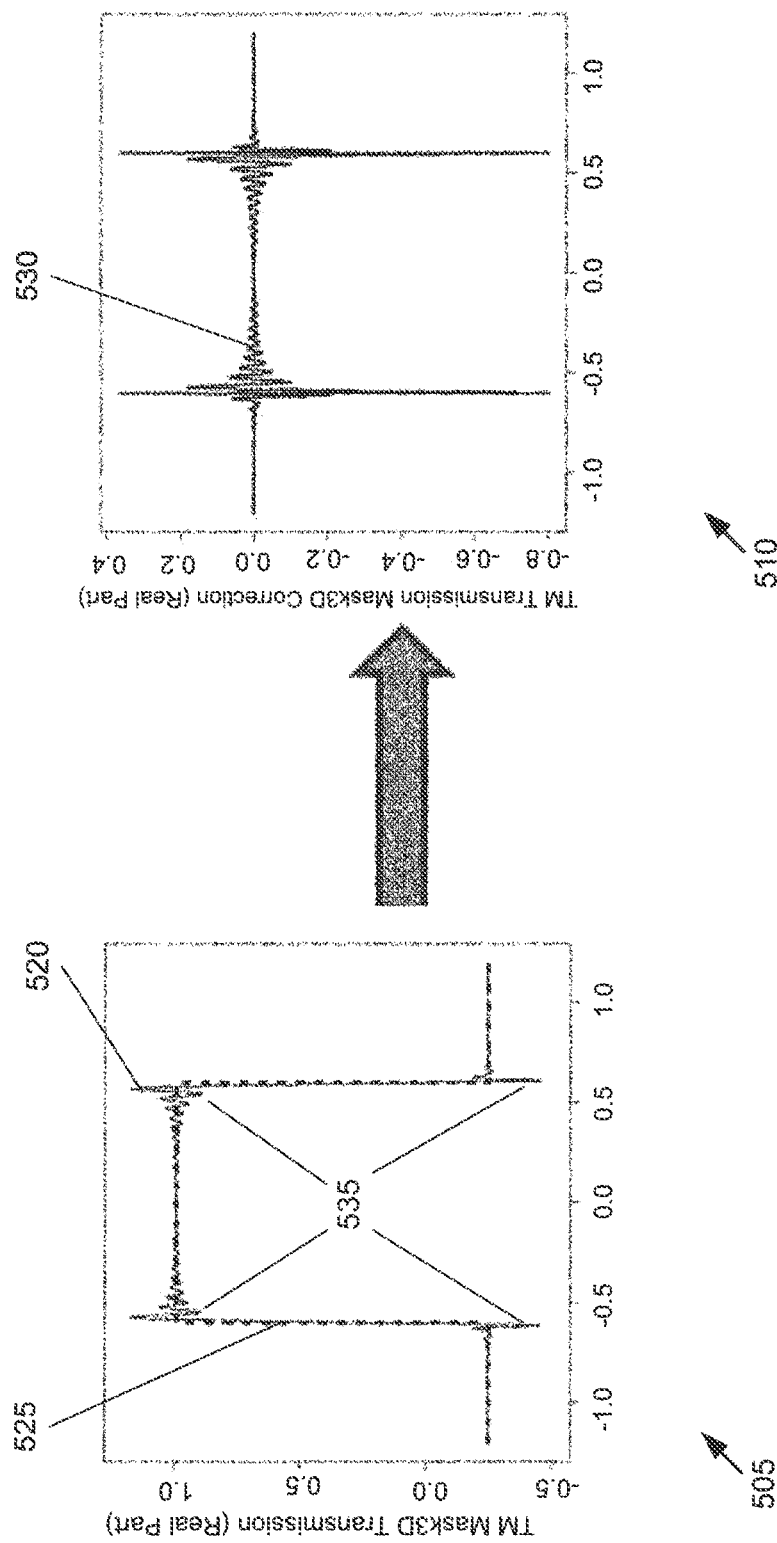
FIG. 5 conceptually illustrates an example of extracting a reference mask 3D residual.

FIG. 5 conceptually illustrates an example of extracting a reference mask 3D residual. Specifically, this figure illustrates the extraction of the mask 3D residual in two stages 505 and 510. In the first stage 505, a near-field 520 reflecting the mask topography effect is displayed. As shown in the figure, the near-field is basically a perturbed mask electric field 535 following the guidance of thin mask electric field 525 (illustrated by the dotted line).

In the second stage 510, a reference mask 3D residual 530 is extracted by subtracting the thin mask electric field 525 from the near-field 520. In one embodiment, a reference mask 3D residual 530 is obtained through subtracting the thin mask electric field 525 from a rigorously simulated near-field 520, as described in blocks 310 and 315 of FIG. 3 above. In one embodiment, the thin mask electric field can be gained with a rasterization with foreground and background transmission. In one embodiment, half-plane is used as the primitive in obtaining the simulated near-field 520. In another embodiment, the thin mask electric field is first biased or processed by a low-pass filter.

In one embodiment, a thick mask model derived from the reference mask 3D residual 530 is applied to a mask design layout to create a mask 3D residual. The mask 3D residual is then combined with a thin mask transmission to create a mask 3D transmission, as described in blocks 215 and 220 of FIG. 2 above.

Figure 6:
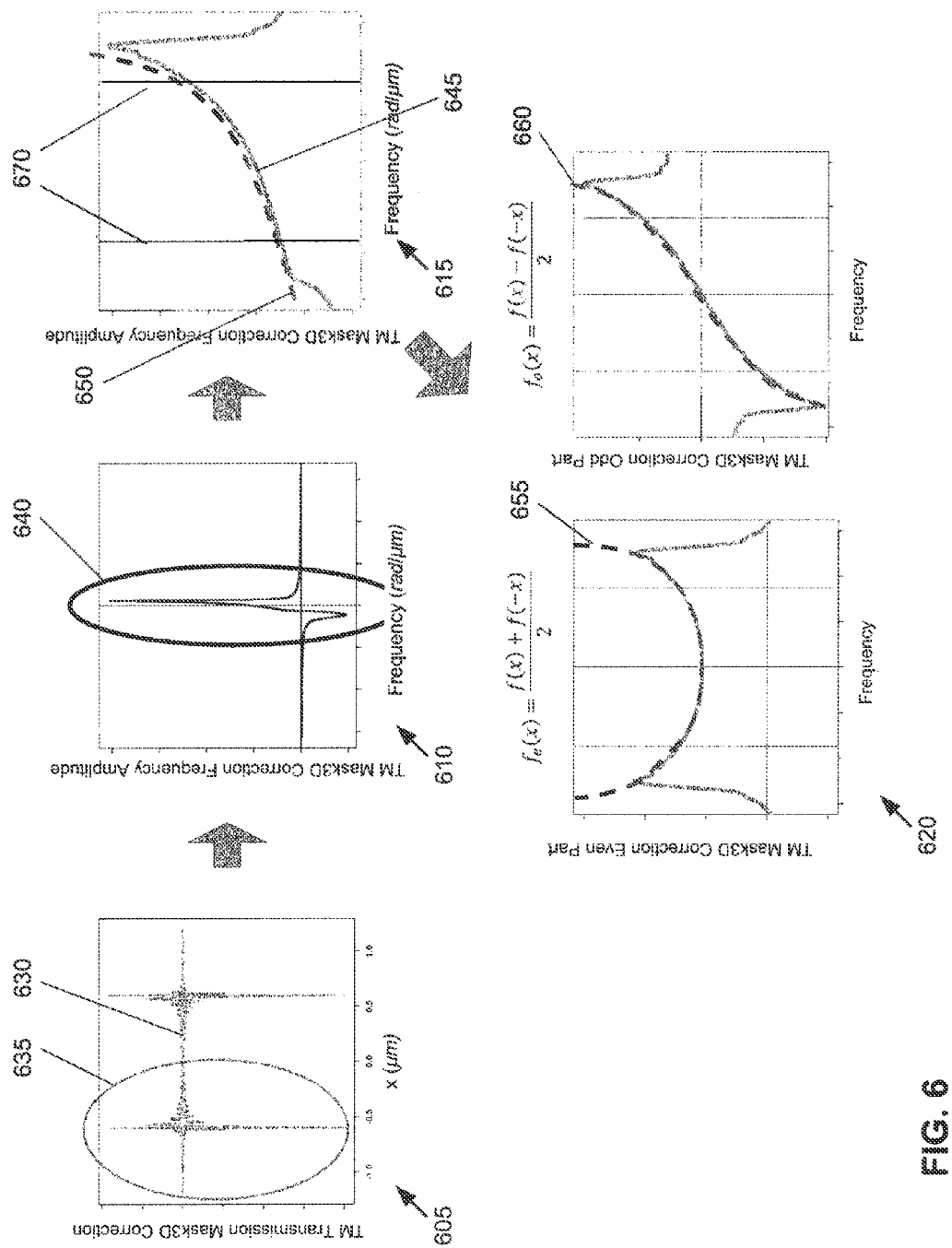
FIG. 6 illustrates an example of extracting edge-based kernels from a reference mask 3D residual.

FIG. 6 illustrates an example of extracting edge-based kernels from a reference mask 3D residual. Specifically, this figure illustrates, through four stages 605, 610, 615, and 620, extracting edge-based kernels for TE polarization from a reference mask 3D residual, as described in block 320 of FIG. 3 above. In one embodiment, extracting of edge-based kernel for TM polarization follows the same stages.

In the first stage 605, a reference mask 3D residual 630 is displayed as a function in the space domain. As shown in the figure, a half-plane 635 of the reference mask 3D residual 630 is extracted.

In the second stage 610, the half-plane 635 of the reference mask 3D residual 630 is transferred into the frequency domain as half-plane 640 using a Fourier Transform.

In the third stage 615, the half-plane 640 in frequency domain is zoomed in. The spectrum 645 in optical bandwidth 670 can be approximated by a smooth polynomial function $f(x)$ 650 (in dotted line), where x is the frequency component.

In the fourth stage 620, the function $f(x)$ 650 in the frequency domain is decomposed into an even component 655 (in dotted line) and an odd component 660 (in dotted line). This decomposition into the even and odd components enables accurate capture of the physical attributes of the edges in the optical mask. In one embodiment, given a function $f(x)$, the even component of $f(x)$ is obtained by $$f_e(x) = \frac{f(x) + f(-x)}{2},$$

and the odd component of $f(x)$ is obtained $$f_o(x) = \frac{f(x) - f(-x)}{2}.$$

Figure 7:
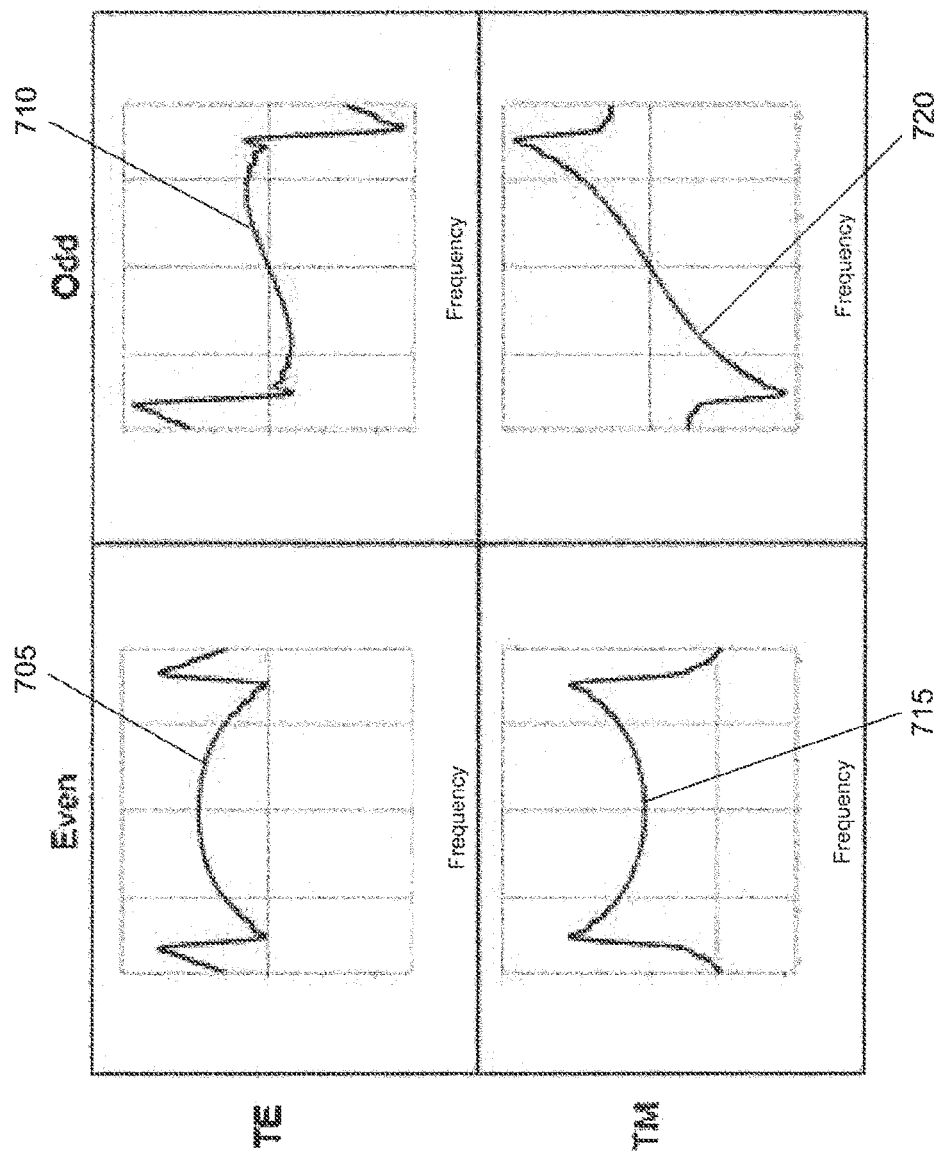
FIG. 7 conceptually illustrates an example of edge-based kernels derived from the reference mask 3D residual.

According to the polarization, the thick mask residual on a single edge can be considered as a unit edge response with TE and TM convolution kernel. FIG. 7 conceptually illustrates an example of edge-based kernels 705, 710, 715 and 720 derived from the reference mask 3D residual. The edge-based kernels 705 and 710 are the even and odd components decomposed from TE polarization. The edge-based kernels 715 and 720 are the even and odd components decomposed from TM polarization. In some of the following paragraphs, the even and odd components of TE or TM polarization are referred to as polarization and polarity matrices.

Figure 8B:
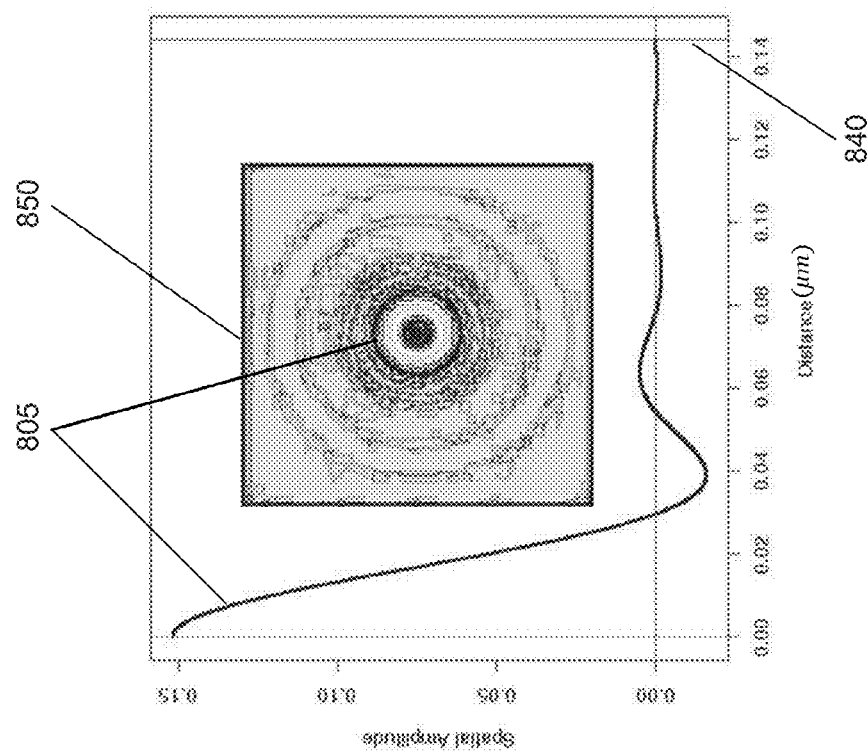
FIG. 8B conceptually illustrates an example of a rasterization filter in the spatial domain in a polar coordinate system.
Figure 8A:
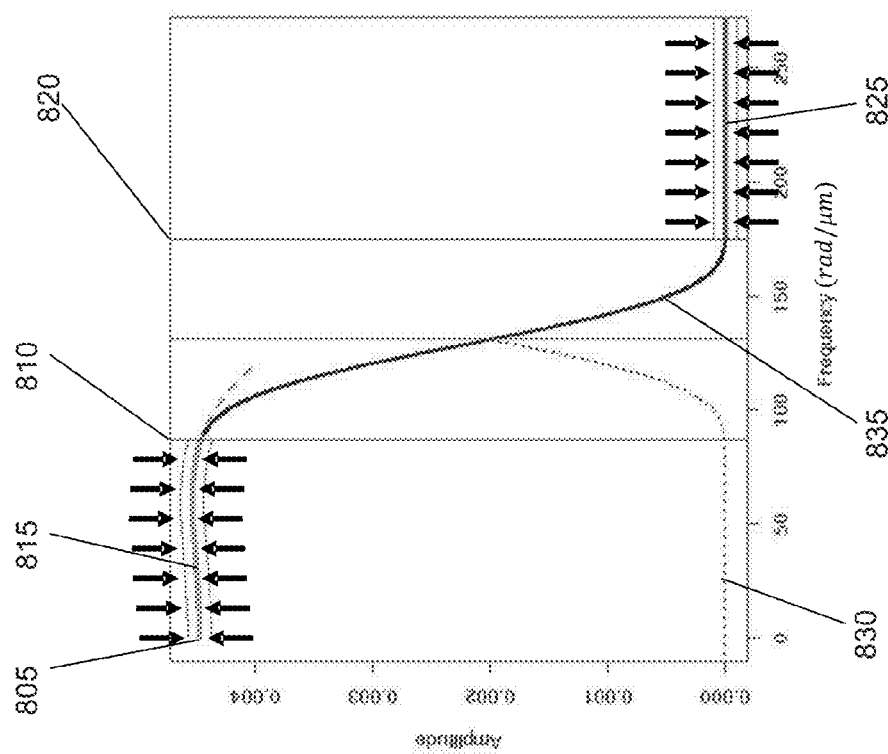
FIG. 8A conceptually illustrates an example of a rasterization filter in the frequency domain.

Once the edge-based kernels are extracted, they are applied to the edges in the mask design layout in a process called rasterization to generate a mask image. However, before the edge-based kernels can be applied in the rasterization process, they need to be filtered in order to enhance the quality and efficiency of the rasterization. FIGS. 8A and 8B conceptually illustrate an example of such a rasterization filter.

FIG. 8A conceptually illustrates an example of a rasterization filter in the frequency domain. Specifically, this figure shows the effects of the rasterization filter 805 on different segments of the edge-based kernels. As illustrated, the rasterization filter 805 has three continuous segments 815, 825, and 835, separated by the optical bandwidth 810 and the mirror point 820 of that optical bandwidth.

The rasterization filter 805 is required to maintain high fidelity within optical bandwidth 810, i.e., to preserve segment 815. The rasterization filter 805 also needs to ensure an output extremely close to zero beyond the mirror point 820, i.e., to filter out signals on segment 825 to maintain low noise. Therefore, the rasterization filter 805 also reduces the effect of spectrum aliasing 830 due to sampling, thus avoiding interference with signals on segment 815. The rasterization filter 805 does not need to care about the segment 835 between the optical bandwidth 810 and the mirror point 820.

FIG. 8B conceptually illustrates an example of a rasterization filter in the spatial domain in a polar coordinate system, where the x-axis is the distance to the original point. As illustrated, the rasterization filter 805 has small spatial domain ambit 840, so that the amount of computation for applying the edge-based kernels will be reduced after those kernels are filtered by the rasterization filter 805.

FIG. 8B displays the top view 850 of the rasterization filter 805. As shown, in one embodiment, the rasterization filter 805 is a series of wave circles with increasing radius. As such, the rasterization filter 805 achieves angular symmetry.

In one embodiment, the rasterization filter can be implemented by Fourier-Bessel orthogonal basis functions. In one embodiment, the rasterization filter is represented as $$K_m(r, \theta) = \sum_{i=1}^{n} c_{im} J_m\left(\frac{a_{m,i} r}{R}\right) \cos(m\theta)$$

where
$K_m$ represents the rasterization filter for an even function of an edge-based kernel when m equals to 0, and represents the rasterization filter for an odd function of an edge-based kernel when m equals to 1,
$c_{im}$ is a coefficient for the rasterization filter,
$J_m$ is an m-order Bessel function of the first kind,
$a_{m,i}$ is the ith root of the m-order Bessel function of the first kind,
r is the distance,
θ is the angle, and
R is the maximum distance, i.e., ambit.

The purpose of the rasterization filter is to maintain high fidelity within optical bandwidth and to attenuate the frequencies beyond the mirror point. The rasterization filter does not concern about the segment between the optical bandwidth and the mirror point. The rasterization filter also needs to produce small spatial domain ambit (e.g., no greater than 0.14 μm) and desired angular symmetry.

Figure 9:
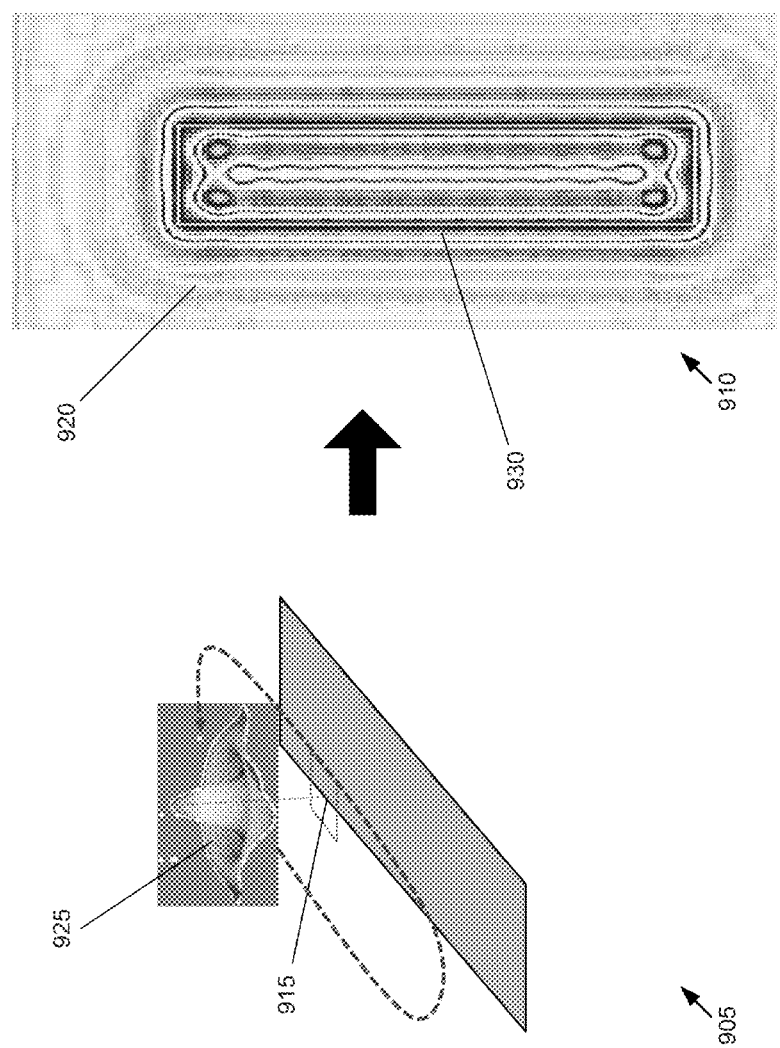
FIG. 9 illustrates an example of applying one of the edge-based kernels to the edges in a mask design layout.

In one embodiment, once the edge-based kernels are filtered by a rasterization filter, they are applied to the edges of a mask design layout. FIG. 9 illustrates an example of applying edge-based kernels to the edges in a mask design layout. Specifically, this figure shows the application of edge-based kernels to the mask design layout in two stages 905 and 910.

Conceptually, each point on a polygon edge emits some disturbance waves. The disturbance wave is edge orientation dependent. The superposition of all these disturbance waves becomes the 3D correction to the thin mask electric field. In the first stage 905, the edge-based kernels 925 are applied to each point (e.g., 915) on polygon edges.

In the second stage 910, as the result of applying the edge-based kernels to the edges, a mask image 920 is generated. The mask image 920 represents the mask 3D residual produced by the mask design layout. Polygon edge 930 is identified on the mask image 920. In one embodiment, the mask image 920 can be combined with a thin mask transmission to create a mask 3D transmission. Because the edge-based kernels capture the physical behavior of the mask, no special consideration is needed for line ends. Therefore, no artifacts are introduced near line ends.

In the examples discussed above, all mask edges are either parallel to or perpendicular to the plane of incidence. All-angle patterns are mask patterns that are neither parallel to nor perpendicular to the plane of incidence. Conventional mask 3D modeling approaches cannot deal with all-angle mask patterns.

Figure 10:
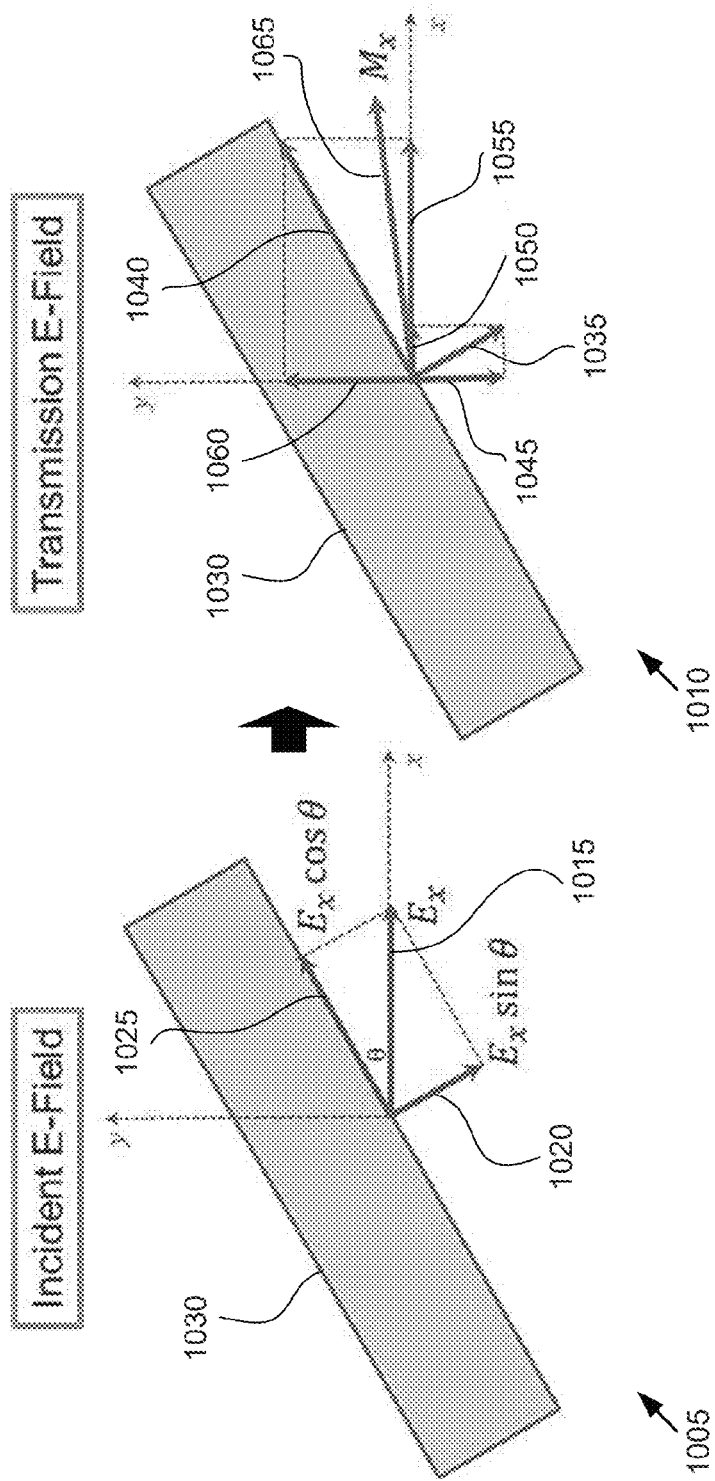
FIG. 10 illustrates an example of processing all-angle patterns using one embodiment of the present invention.

FIG. 10 illustrates an example of processing all-angle patterns using one embodiment of the present invention. Specifically, this figure shows that all-angle patterns can be decomposed into their polarization and generate the near-field components separately through two stages 1005 and 1010.

In the first stage 1005, an edge 1030 is neither parallel to nor perpendicular to an incident electric field $E_x$ 1015. Instead, the angle between the edge 1030 and the incident electric field $E_x$ 1015 is θ. To generate the near-field component of the incident electric field $E_x$ 1015, the incident electric field $E_x$ 1015 is decomposed into a TE component 1025 parallel to the edge 1030, represented as $E_x \cos θ$, and a TM component 1020 perpendicular to the edge 1030, represented as $E_x \sin θ$.

In the second stage 1010, in the transmission electric field, a near-field component 1040, represented as TE cos θ, is generated for the TE component 1025, and a near-field component 1035, represented as TM sin θ, is generated for the TM component 1020. The near-field component 1040 is the mask 3D residual of TE component 1025 and the near-field component 1035 is the mask 3D residual of TM component 1020. The near-field component 1040 can be decomposed into a component 1055 on X axis and a component 1060 on Y axis. The component 1055 can be represented as $TE \cos^2 θ$. The component 1060 can be represented as TE sin θ cos θ. Similarly, the near-field component 1035 can be decomposed into a component 1050 on X axis and a component 1045 on Y axis. The component 1050 can be represented as $TM \sin^2 θ$. The component 1045 can be represented as −TM sin θ cos θ.

The transmission electric field $M_x$ 1065 of the incident electric field $E_x$ 1015 can be generated by combining the near-field components 1035 and 1040. Therefore, the value of $M_x$ 1065 on X axis is $TM \sin^2 θ + TE \cos^2 θ$, and the value of $M_x$ 1065 on Y axis is −TM sin θ cos θ+TE sin θ cos θ. The transmission electric field $M_x$ 1065 is the mask 3D residual of the incident electric field $E_x$ 1015.

Figure 11:
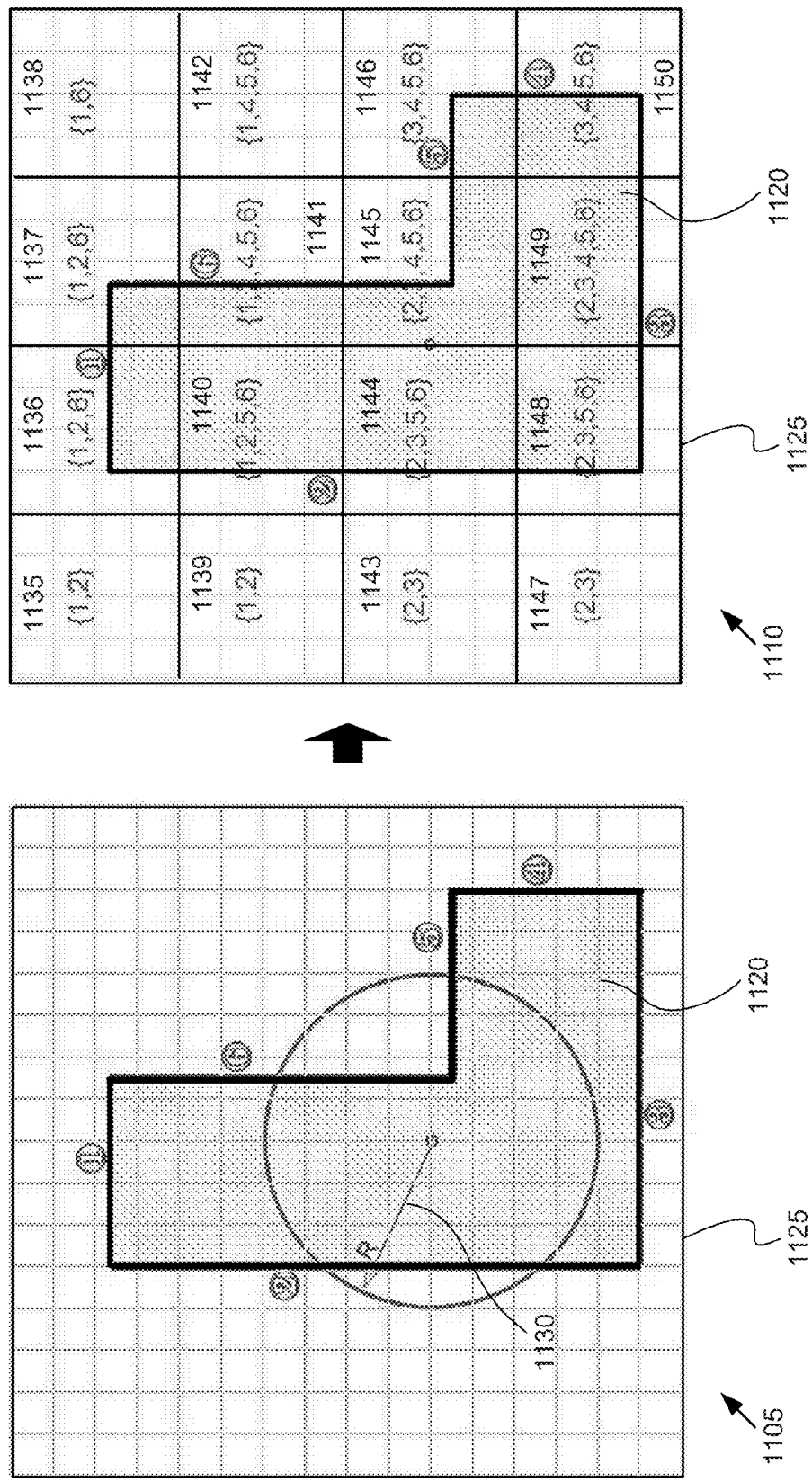
FIG. 11 illustrates an example of one embodiment to minimize edge check during rasterization.

During the rasterization process, it will be computationally expensive if every point on a mask design layout is checked with every edge in the mask design layout. FIG. 11 illustrates an example of one embodiment to minimize edge check during rasterization. Specifically, this figure shows that a record can be used on each region of the mask design layout to avoid unnecessary edge operations. In one embodiment, the edge check efficiency is improved through two stages 1105 and 1110.

In the first stage 1105, a mask design layout 1125 is displayed. The mask design layout 1125 contains a feature 1120, which is enclosed by six edges 1-6. The region of influence for any point on an edge is a circle that takes the point as its center point and has a radius of R 1130.

In the second stage 1110, the mask design layout 1125 is divided into sixteen regions 1135-1150. Each region is associated with a set of edges that have influence on that region. For example, edges 1 and 2 are associated with the region 1135 because the region 1135 is within the radius R 1130 of some points on edges 1 and 2. Therefore, instead of checking all six edges of the feature 1120, only edges 1 and 2 need to be checked when points in region 1135 are rasterized. Edges 1, 2, and 6 are associated with the region 1136 because part of edges 1 and 2 are within region 1136 and region 1136 is within the radius R 1130 of some points on edge 6. Therefore, instead of checking all six edges of the feature 1120, only edges 1, 2, and 6 need to be checked when points in region 1136 are rasterized.

Figure 12:
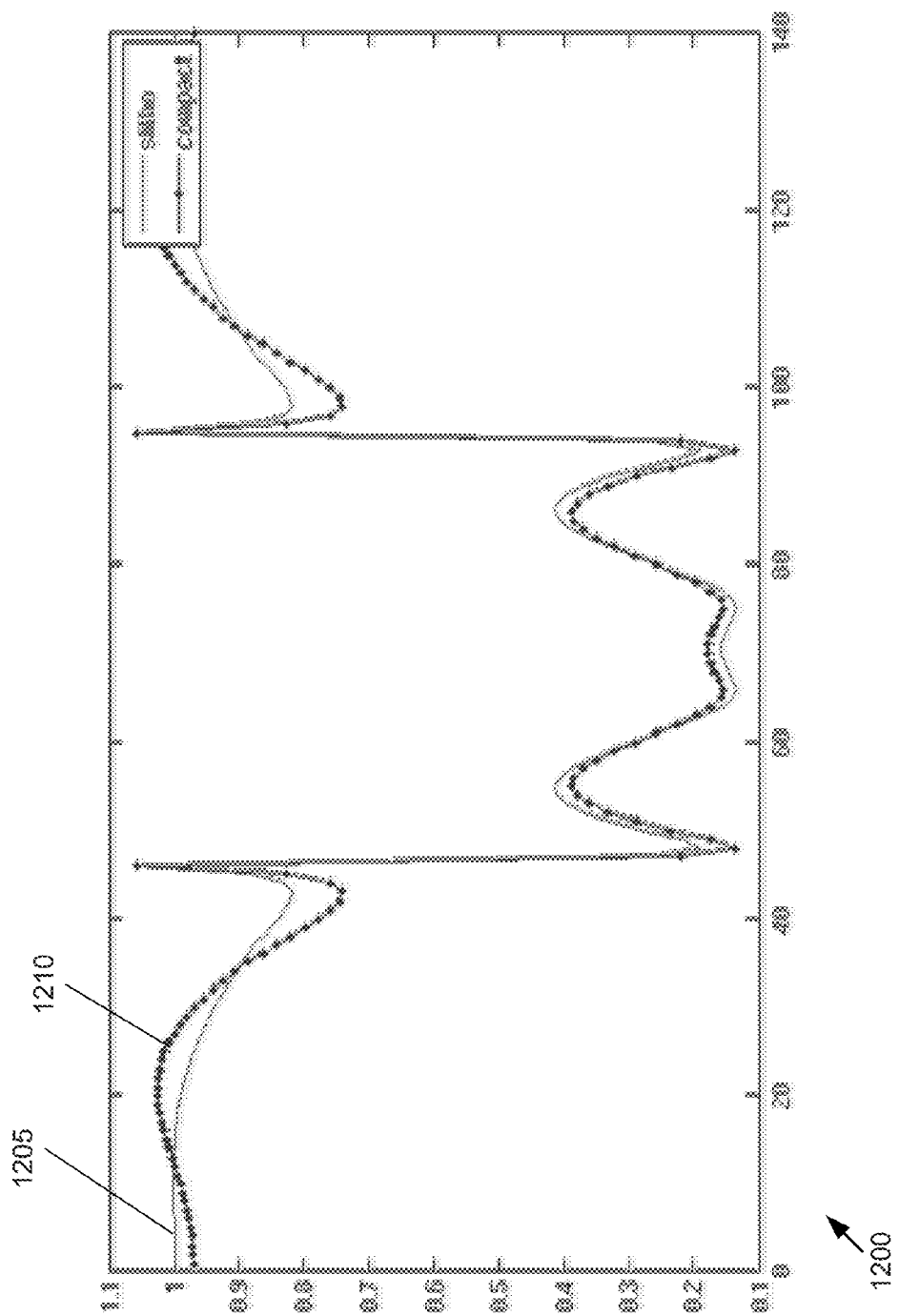
FIG. 12 illustrates an example of the impact of edge coupling effect on the near-field of mask topography effect.

In photolithography simulation, strong edge coupling effect will be generated when feature size and space are small. FIG. 12 illustrates an example of the impact of edge coupling effect on the near-field of mask topography effect. Specifically, the figure illustrates the difference between the near-field generated by rigorous simulation and the near-field generated by the edge-based simulation model described above.

As shown in FIG. 12, the chart 1200 displays two near-fields 1205 and 1210 of mask topography effect. The near-field 1205 (represented as a solid line) is generated by a rigorous simulation. The near-field 1210 (represented as a dotted line) is generated by the edge-based simulation model using half-plane. FIG. 12 shows that there is strong mismatch between the two near-fields 1205 and 1210 because the edge-based simulation model described above does not take edge coupling effect into consideration.

Figure 13:
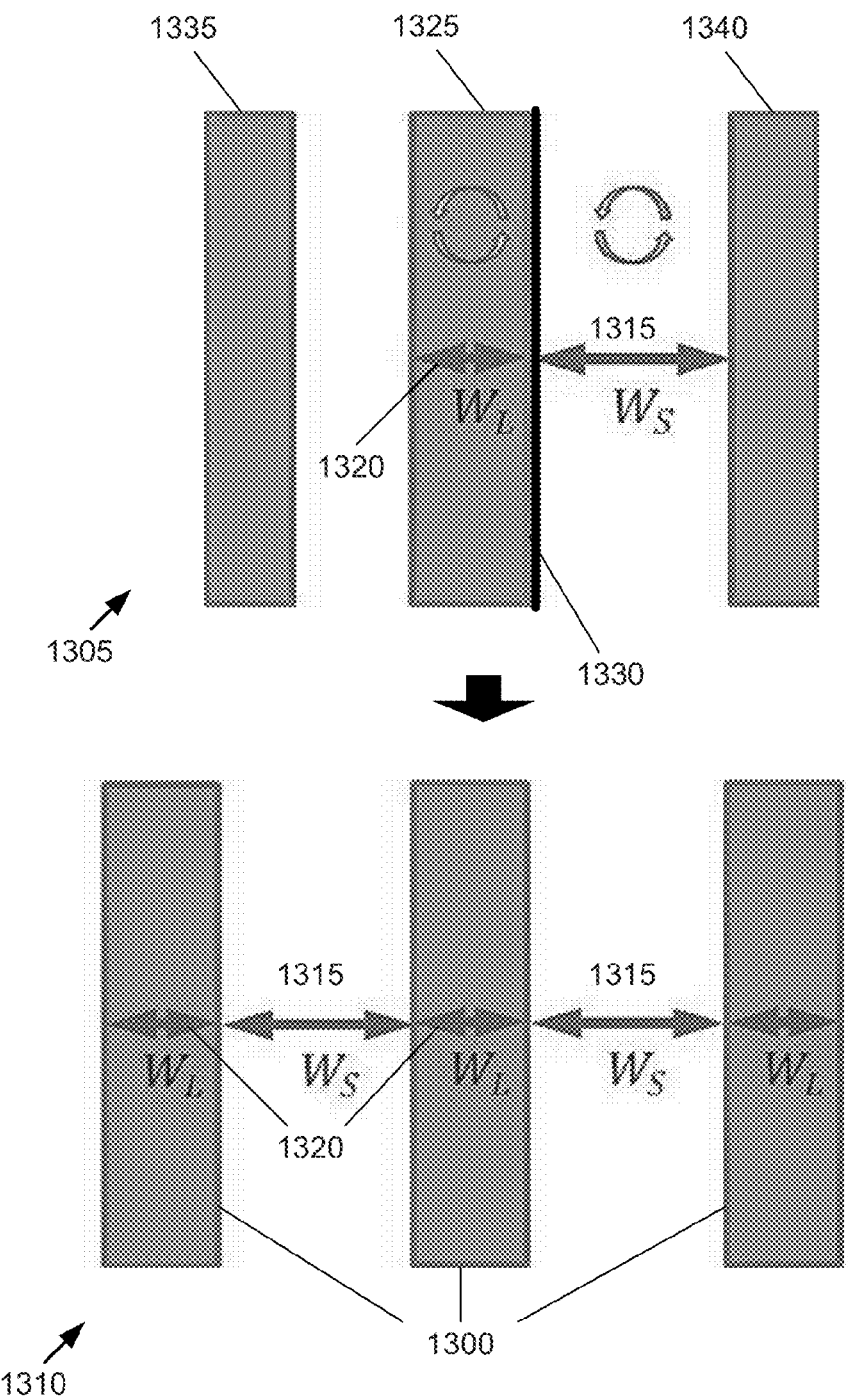
FIG. 13 illustrates an example of one embodiment for generating near-field reference for edge coupling effect.

FIG. 13 illustrates an example of one embodiment for generating near-field reference for edge coupling effect. Specifically, this figure shows generating a reference near-field for edge coupling effect by using a periodic feature structure 1300. The generation of the reference near-field is illustrated in two stages 1305 and 1310.

In the first stage 1305, three features 1325, 1335, and 1340 of a bi-tone mask are displayed. A bi-tone mask is a simple mask that is described by two colors to represent features and non-features on the mask. Edge 1330 is one of the edges of feature 1325. The width of feature 1325 is $W_L$ 1320. The space between features 1325 and 1340 is $W_S$ 1315. In one embodiment, the edge coupling effect on edge 1330 is assumed to be completely determined by two distance parameters: feature width $W_L$ 1320 and feature space $W_S$ 1315.

In the second stage 1310, the periodic feature structure 1300 is created for the bi-tone mask. In one embodiment, each feature in the periodic feature structure 1300 has a feature width of $W_L$ 1320. In one embodiment, each space between features in the periodic feature structure 1300 is $W_S$ 1315. In one embodiment, the reference near-field for edge coupling effect with feature width $W_L$ 1320 and feature space $W_S$ 1315 can be generated based on the periodic feature structure 1300.

A periodic feature structure for a bi-tone mask is described above. One of ordinary skill in the art will recognize that periodic feature structures can also be created for multi-tone masks, which are described by more than two colors.

Figure 14:
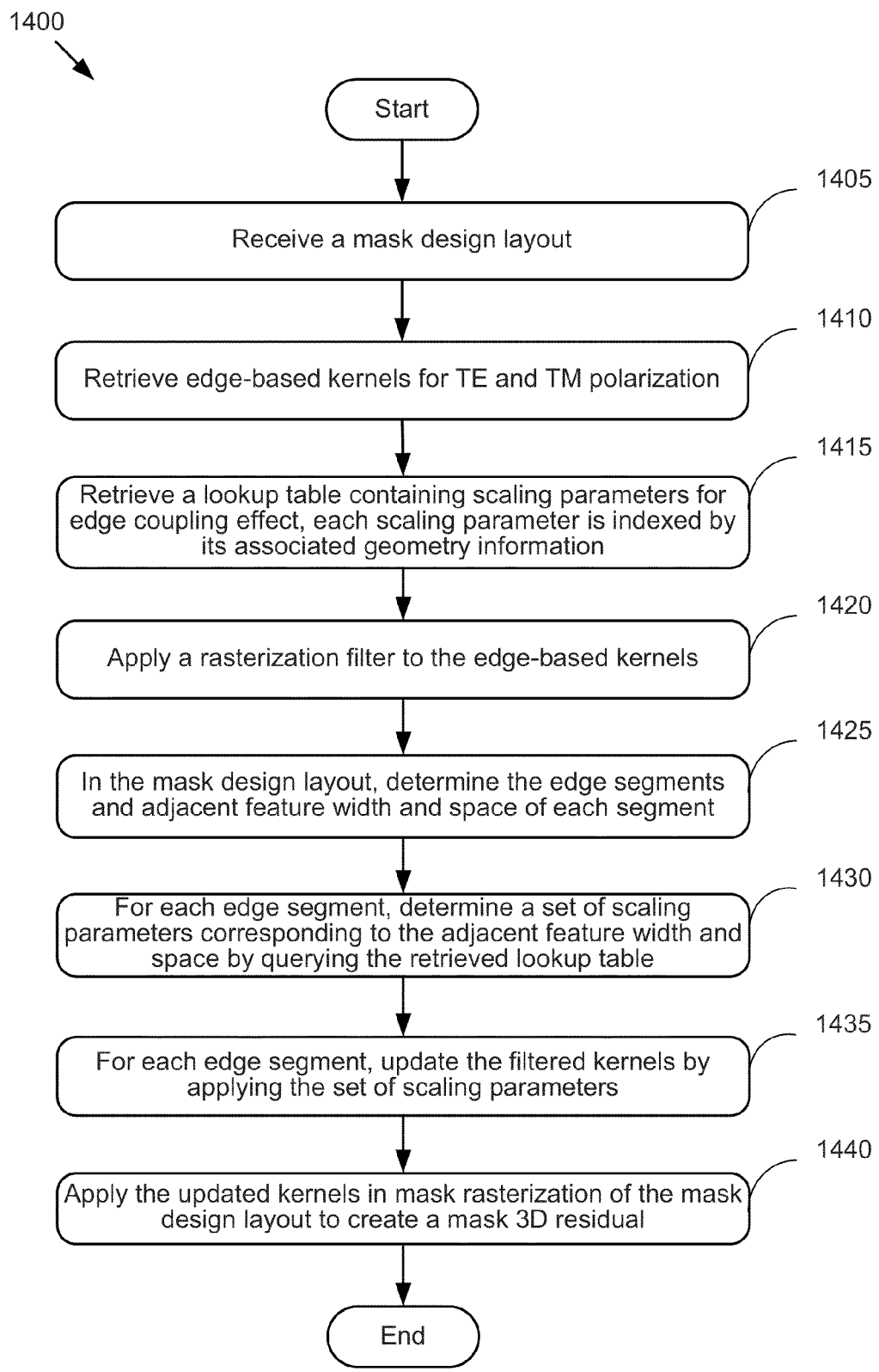
FIG. 14 is a flowchart of one embodiment of applying thick mask model that captures edge coupling effect in a mask design layout.

FIG. 14 is a flowchart of one embodiment of applying thick mask model that captures edge coupling effect in a mask design layout. Specifically, this figure describes a process 1400 that adjusts edge-based kernels of the thick mask model with scaling parameters for edge coupling effect and applies the adjusted kernels in generating mask image. In one embodiment, the process 1400 starts after a lookup table containing scaling parameters for edge coupling effect has been generated. In one embodiment, the table is generated by the process described in FIG. 15 below. In one embodiment, the process 1400 corresponds to block 215 described in FIG. 2 above. As shown in the figure, the process 1400 begins by receiving, at block 1405, a mask design layout. In one embodiment, the mask design layout is in the form of a polygon-based hierarchical data file in the GDS (Graphic Database System) or OASIS.MASK format.

At block 1410, the process 1400 retrieves edge-based kernels for TE polarization and TM polarization. In one embodiment, the edge-based kernels are generated by the process described in FIG. 3 above.

At block 1415, the process 1400 retrieves a lookup table containing scaling parameters for edge coupling effect. In one embodiment, each scaling parameter in the lookup table is indexed by its associated geometry information. In one embodiment, the geometry information is a combination of feature width and feature space. In one embodiment, the lookup table is generated by a process described in FIG. 15 below.

The process 1400, at block 1420, applies a rasterization filter to the edge-based kernels. In one embodiment, the preferred rasterization filter has the following criteria: maintaining high fidelity within optical bandwidth; attenuating the frequencies beyond mirror point of the optical bandwidth; having small spatial-domain ambit (e.g., no greater than 0.14 µm) and desired angular symmetry. In one embodiment, Fourier-Bessel orthogonal basis functions are used as the rasterization filter. One embodiment of the rasterization filter is described in FIG. 8 above.

At block 1425, the process 1400 determines the edge segments in the mask design layout and the adjacent feature width and space of each edge segment. For each edge segment, the process 1400, at block 1430, determines a set of scaling parameters corresponding to the adjacent feature width and space by querying the retrieved lookup table using the adjacent feature width and space.

For each edge segment, at block 1435, the process 1400 updates the filtered kernels by applying the set of scaling parameters determined for the edge segment. In one embodiment, the set of scaling parameters includes four scaling parameters, each of which is applied to one of the even and odd components of TE and TM polarization kernels. For example, in one embodiment, for TE polarization, the updated kernels $K_1$ and $K_2$ can be calculated by, $$K_1 = p_1(w,p) \times K_{even}$$

$$K_2 = p_2(w,p) \times K_{odd}$$

where
$K_{even}$ and $K_{odd}$ are original edge-based even and odd component kernels, respectively,
$p_1(w, p)$ and $p_2(w, p)$ are scaling parameters associated with feature width w and space p.

The process 1400, at block 1440, applies the updated kernels in mask rasterization to edges in the mask design layout to produce a mask 3D residual. The mask 3D residual is described in FIG. 9 above. The process 1400 then ends.

One of ordinary skill in the art will recognize that the process 1400 is a conceptual representation of the operations used to apply the thick mask model. The specific operations of the process 1400 may not be performed in the exact order shown and described. For example, the edge-based kernels can be updated with the scaling parameters before being filtered by the rasterization filter. The specific operations may not be performed in one continuous series of operations, and different specific operations may be performed in different embodiments. Furthermore, the process could be implemented using several sub-processes, or as part of a larger macro process. For instance, in some embodiments, the process 1400 is performed by one or more software applications that execute on one or more computers.

Figure 15:
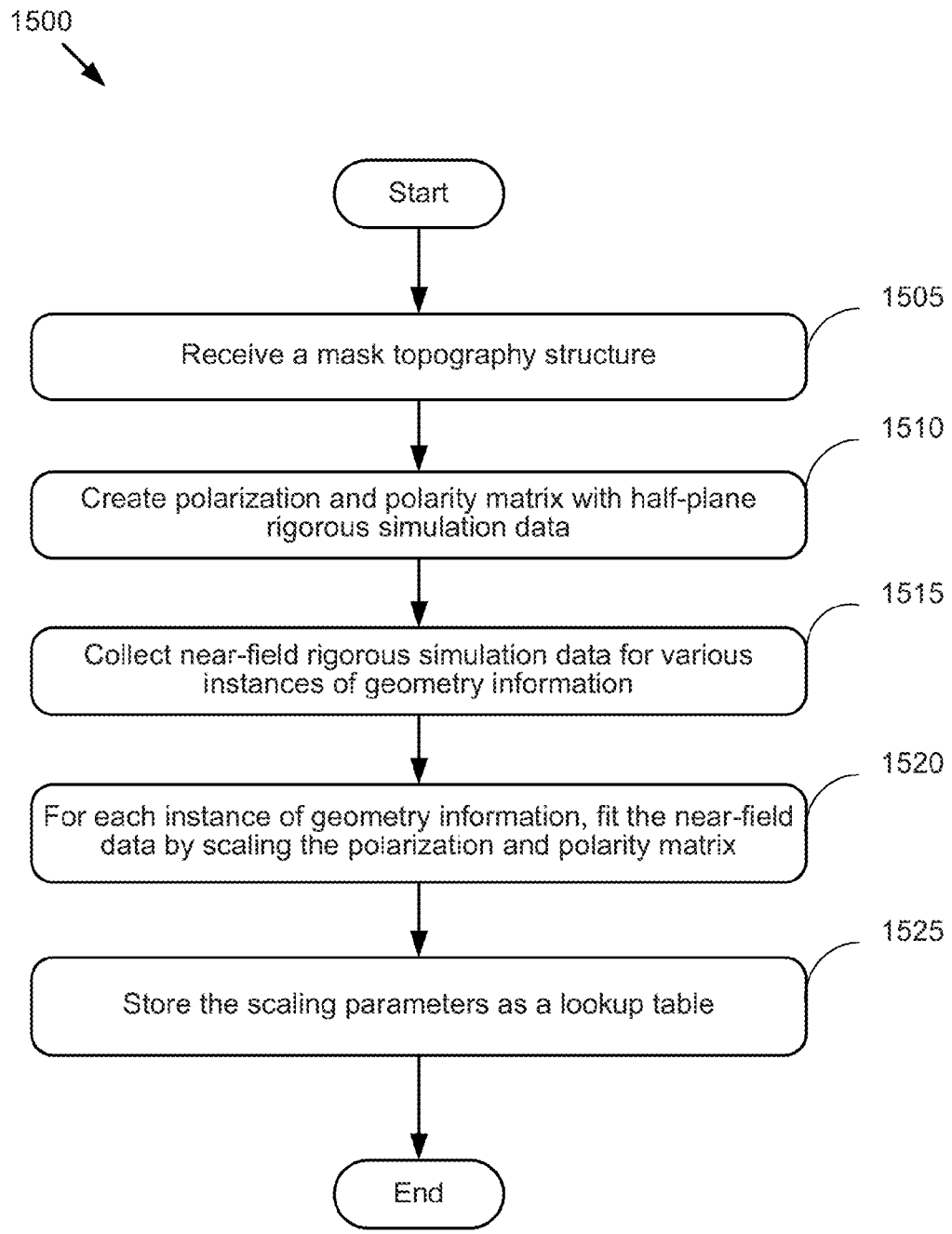
FIG. 15 is a flowchart of one embodiment of building a lookup table that stores scaling parameters for edge coupling effect.

FIG. 15 is a flowchart of one embodiment of building a lookup table that stores scaling parameters for edge coupling effect. Specifically, this figure describes a process 1500 that uses linear regression to fit scaling parameters for various instances of geometry information related to edge coupling effect. In one embodiment, the process 1500 starts before a thick mask model that can capture edge coupling effect needs to be applied, e.g., by the process described in FIG. 14 above. As shown in the figure, the process 1500 begins by receiving, at block 1505, a mask topography structure. The mask topography structure is the physical 3D structure of the real mask that could distort the near-field image of mask from the ideal thin mask model. In one embodiment, the mask topography structure is a combination of factors, including material, geometry setting and process variations, in mask making and implementations.

At block 1510, the process 1500 creates polarization and polarity matrix with half-plane rigorous simulation data. In one embodiment, polarization and polarity matrix is based on the edge-based kernels described in FIGS. 3 and 6 above.

At block 1515, the process 1500 collects near-field rigorous simulation data for various instances of geometry information. In one embodiment, each instance of geometry information is a combination of feature width and feature space.

For each instance of geometry information, the process 1500, at block 1520, fits the near-field rigorous simulation data by scaling the polarization and polarity matrix using linear regression. For example and in one embodiment, linear regression is performed on the equations below to solve for scaling parameters p1 and p2 for an instance of geometry information:

$$K_{even}(x_1) \times p_1 + K_{odd}(x_1) \times p_2 = K(x_1)$$

$$K_{even}(x_i) \times p_1 + K_{odd}(x_i) \times p_2 = K(x_i)$$

$$K_{even}(x_n) \times p_1 + K_{odd}(x_n) \times p_2 = K(x_n)$$

where
$K_{even}$ and $K_{odd}$ constitute the polarization and polarity matrix created in block 1510 described above,
K represents the near-field rigorous simulation data for the instance of geometry information,
$x_1 \ldots x_n$ are n discrete frequency components within optical bandwidth for the instance of geometry information.

At block 1525, the process 1500 stores the scaling parameters obtained above through linear regression. In one embodiment, the scaling parameters are stored as a lookup table. The process 1500 then ends.

One of ordinary skill in the art will recognize that the process 1500 is a conceptual representation of the operations used to apply the thick mask model. The specific operations of the process 1500 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 1500 is performed by one or more software applications that execute on one or more computers.

In one embodiment, the lookup table with scaling parameters for various instances of geometry information is generated once and can be reused as long as the mask structure is unchanged. It takes constant time to look up the scaling parameters and apply them to the mask rasterization.

Figure 16:
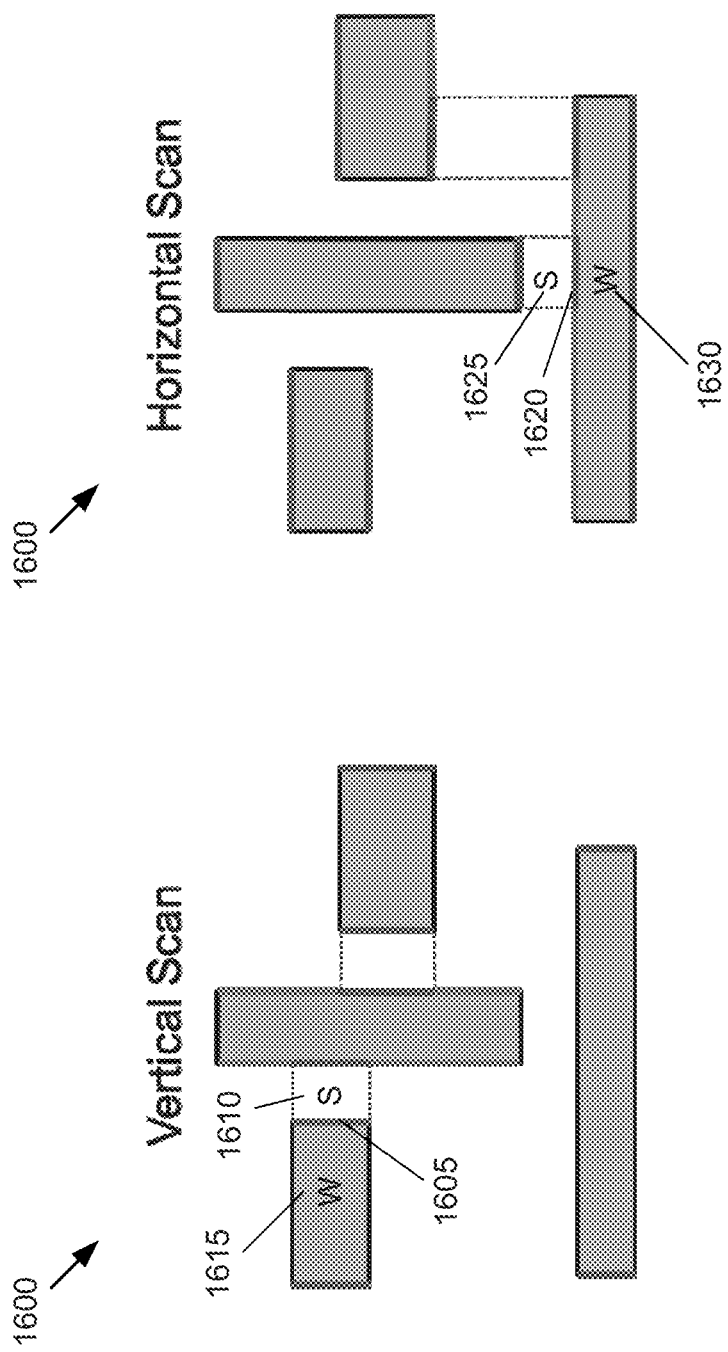
FIG. 16A illustrates using vertical scan to determine vertical edge segments and adjacent feature width and space.
FIG. 16B illustrates using horizontal scan to determine horizontal edge segments and adjacent feature width and space.

As described in block 1425 of FIG. 14 above, to address edge coupling effect, edge segments in a mask design layout and adjacent feature width and space of each edge segment are determined. FIG. 16A-16B illustrates an example of one embodiment to use scanline algorithm to determine edge segments and adjacent feature width and space.

FIG. 16A illustrates using vertical scan to determine vertical edge segments and adjacent feature width and space. Specifically, this figure shows performing vertical scan on a mask design layout 1600. As a result of the vertical scan, vertical edge segments, such as edge segment 1605 is detected, as well as the adjacent feature width 1615 and space 1610 of the edge segment 1605.

FIG. 16B illustrates using horizontal scan to determine horizontal edge segments and adjacent feature width and space. Specifically, this figure shows performing horizontal scan on the mask design layout 1600. As a result of the horizontal scan, horizontal edge segments, such as edge segment 1620, are detected, as well as the adjacent feature width 1630 and space 1625 of the edge segment 1620.

Figure 17:
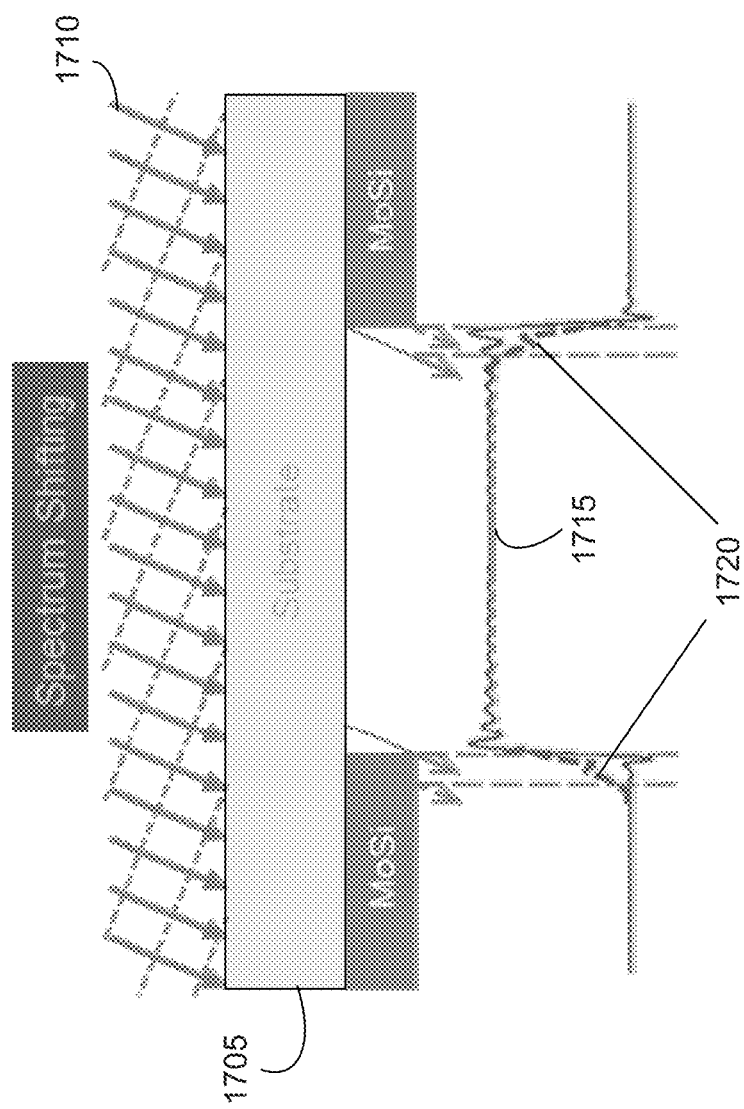
FIG. 17 illustrates the difference between mask images generated under regular illumination and OAI.

In photolithography, off-axis illumination (OAI) is an optical system setup in which the incoming light strikes the optical mask at an oblique angle rather than perpendicularly, that is to say, the incident light is not parallel to the axis of the optical system. In one embodiment, OAI is used in real model calibration. FIG. 17 illustrates the difference between mask images generated under regular illumination and OAI. Specifically, this figure shows light 1710 passes through an optical mask 1705 at an oblique angle. Pattern 1715 is the mask image that would have been generated under regular illumination. Pattern 1720 is the mask image generated under OAI, which is different from pattern 1715. Therefore, under OAI, the thick mask model is adjusted to handle the partial coherence caused by off-axis illumination.

FIG. 18A conceptually illustrates an example of shadowing effect. Curve 1805 represents the even component of half-plane residual in the frequency domain, as described in FIG. 6 above. Curve 1810 represents the corresponding curve in the spatial domain. The adjustment of the even component of half-plane residual can be viewed as moving curve 1815 vertically and horizontally to reach the position of curve 1820. This kind of adjustment is called shadowing effect.

FIG. 18B conceptually illustrates an example of blurring effect. Curve 1825 represents the odd component of half-plane residual in the frequency domain, as described in FIG. 6 above. Curve 1830 represents the corresponding curve in the spatial domain. The adjustment of the odd component of half-plane residual can be viewed as tilting curve 1835 around the point 1850 to reach the position of curve 1840. This kind of adjustment is called blurring effect.

In one embodiment, it is assumed that OAI effective mask depends on an OAI source, instead of the location of individual source points. It is also assumed that scaling parameters are for OAI effective mask, which can be determined by matching the optical intensity to rigorous OAI simulation results. Different off-axis illumination can be viewed as different tuning of the shadowing and blurring effect. In one embodiment, scaling parameters are introduced to tune the shadowing and blurring effect.

With a selection of the reference test pattern, the near-field for an intensive atomic setting (i.e., a configuration of atomic points on the optical source plane) of the pixelated optical source can be generated. The exact optical source is then imported to generate the reference light intensity signal or to measure critical dimension (CD) through rigorous simulation. A critical dimension is the dimensionality of space at which the character of the phase transition changes. An efficient regression flow can be adopted to generate the tuning parameters. For each of the optics and mask structures, the tuning parameter only needs to be generated once. Once generated, those tuning parameters can be reused effectively for the overall regular mask patterns.

Figure 19:
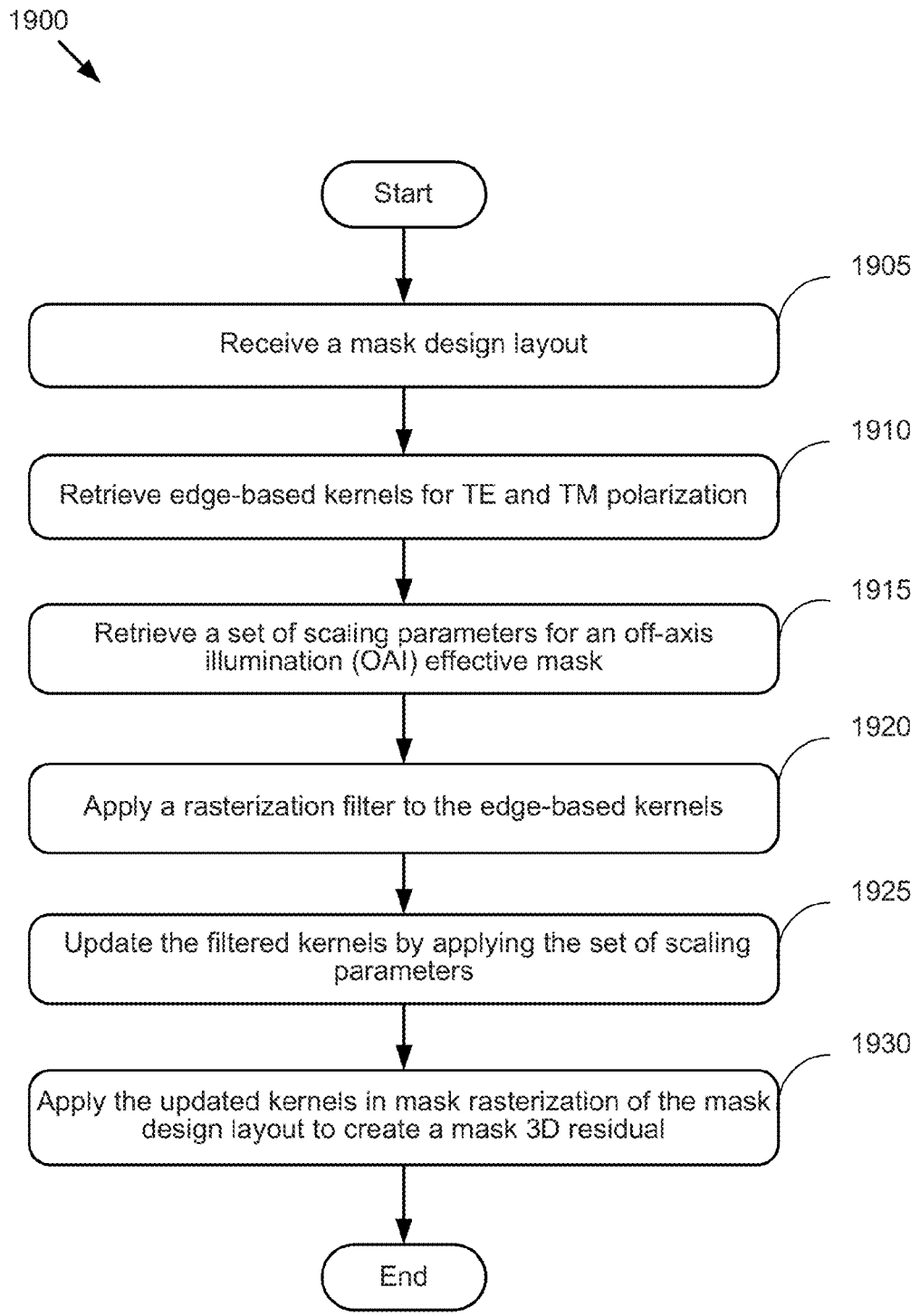
FIG. 19 is a flowchart of one embodiment of applying thick mask model that deals with off-axis illumination to a mask design layout.

FIG. 19 is a flowchart of one embodiment of applying thick mask model that deals with off-axis illumination to a mask design layout. Specifically, this figure describes a process 1900 that adjusts edge-based kernels of the thick mask model with scaling parameters for different OAI effective masks and applies the adjusted kernels in generating mask image. In one embodiment, the process 1900 starts after a set of scaling parameters for different OAI effective masks has been generated. In one embodiment, these parameters are generated by processes described in FIGS. 20 and 21 below. In one embodiment, the process 1900 corresponds to block 215 described in FIG. 2 above. As shown in the figure, the process 1900 begins by receiving, at block 1905, a mask design layout. In one embodiment, the mask design layout is in the form of a polygon-based hierarchical data file in the GDS (Graphic Database System) or OASIS.MASK format.

At block 1910, the process 1900 retrieves edge-based kernels for TE polarization and TM polarization. In one embodiment, the edge-based kernels are generated by the process described in FIG. 3 above.

At block 1915, the process 1900 retrieves a set of scaling parameters for an OAI effective mask. In one embodiment, the set of scaling parameters is generated by processes described in FIGS. 20 and 21 below.

The process 1900, at block 1920, applies a rasterization filter to the edge-based kernels. In one embodiment, the preferred rasterization filter has the following criteria: maintaining high fidelity within optical bandwidth; attenuating the frequencies beyond mirror point of the optical bandwidth; having small spatial-domain ambit (e.g., no greater than 0.14 µm) and desired angular symmetry. In one embodiment, Fourier-Bessel orthogonal basis functions are used as the rasterization filter. One embodiment of the rasterization filter is described in FIG. 8 above.

At block 1925, the process 1900 updates the filtered kernels by applying the set of scaling parameters to the filtered kernels. The process 1900, at block 1930, applies the updated kernels in mask rasterization to edges in the mask design layout to produce a mask 3D residual. The mask 3D residual is described in FIG. 9 above. The process 1900 then ends.

One of ordinary skill in the art will recognize that the process 1900 is a conceptual representation of the operations used to apply the thick mask model. The specific operations of the process 1900 may not be performed in the exact order shown and described. For example, the edge-based kernels can be updated with the scaling parameters before being filtered by the rasterization filter. The specific operations may not be performed in one continuous series of operations, and different specific operations may be performed in different embodiments. Furthermore, the process could be implemented using several sub-processes, or as part of a larger macro process. For instance, in some embodiments, the process 1900 is performed by one or more software applications that execute on one or more computers.

Figure 20:
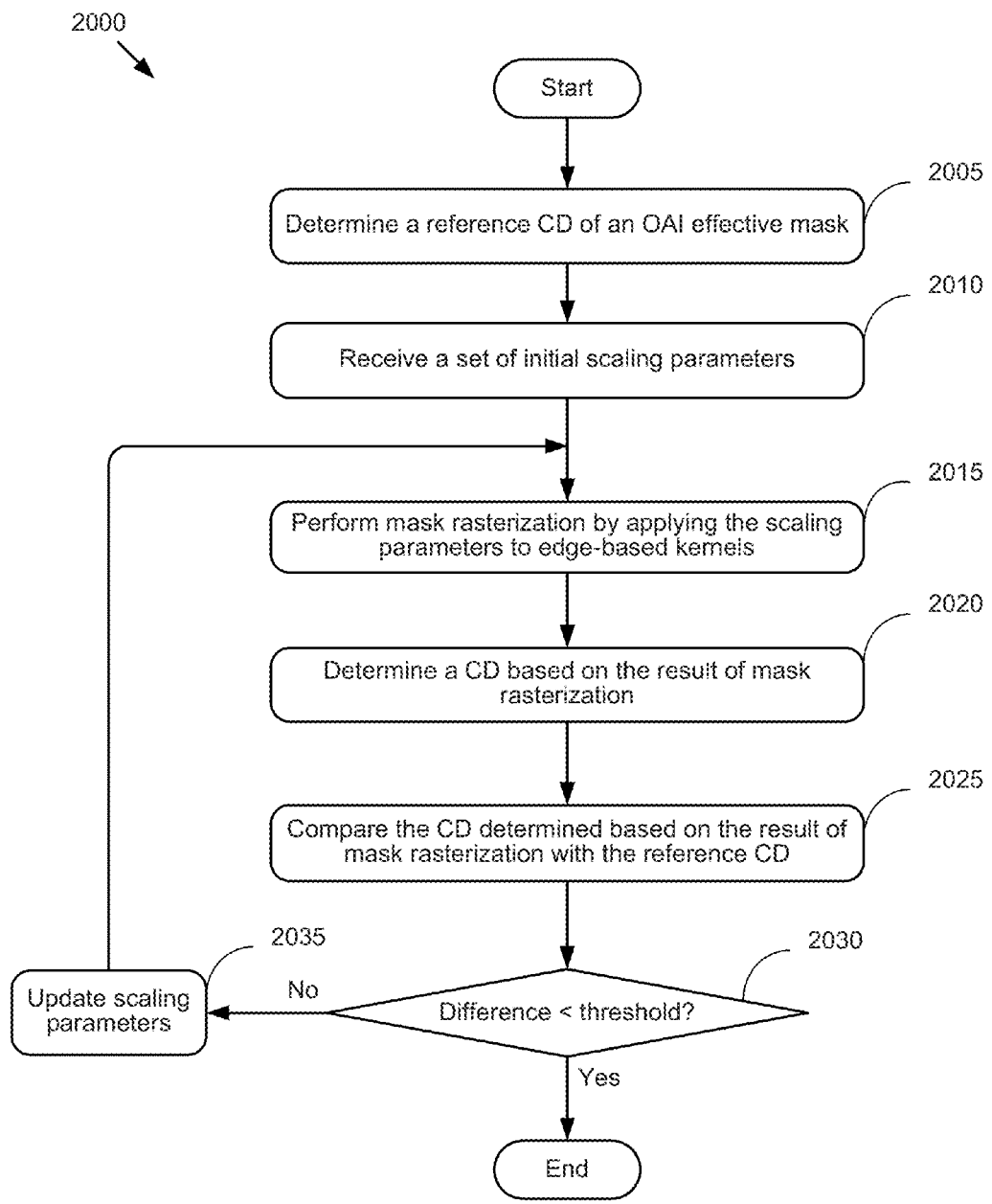
FIG. 20 is a flowchart of one embodiment of fitting scaling parameters for an off-axis illumination effective mask using critical dimension (CD) reference.

FIG. 20 is a flowchart of one embodiment of fitting scaling parameters for an off-axis illumination effective mask using critical dimension (CD) reference. Specifically, this figure describes a process 2000 that uses CD reference to gradually adjust scaling parameters for the OAI effective mask. In one embodiment, the process 2000 starts before a thick mask model that can deal with the OAI effective mask is applied. In one embodiment, the process described in FIG. 19 above illustrates applying a thick mask model that deals with the OAI effective mask. As shown in the figure, the process 2000 begins by determining, at block 2005, a reference CD of an OAI effective mask. In one embodiment, the reference CD is obtained through rigorous simulation. In another embodiment, the reference CD is obtained through measuring a physical wafer.

At block 2010, the process 2000 receives a set of initial scaling parameters for the OAI effective mask. In one embodiment, the set of initial scaling parameters are all set at 1.

At block 2015, the process 2000 performs mask rasterization by applying the scaling parameters to edge-based kernels. In one embodiment, the edge-based kernels are generated in the process described in FIG. 3 above.

The process 2000, at block 2020, determines a CD based on the result of the mask rasterization. At block 2025, the process 2000 compares the CD determined based on the result of mask rasterization with the reference CD.

At block 2030, the process 2000 determines whether the difference between the CD determined based on the result of mask rasterization and the reference CD is smaller than a pre-determined threshold. If the difference is not smaller than the pre-determined threshold, the process 2000 updates, at block 2035, the scaling parameters through an optimization method. In one embodiment, the scaling parameters are updated through a global search. In one embodiment, the scaling parameters are updated through an adaptive search. In one embodiment, the optimization method is one of the downhill simplex method, conjugate gradient method, and gradient descent method. The process 2000 then loops back to block 2015 to perform another mask rasterization by applying the updated scaling parameters to the edge-based kernels.

If the difference between the CD determined based on the result of mask rasterization and the reference CD is smaller than the pre-determined threshold, the process 2000 ends.

One of ordinary skill in the art will recognize that the process 2000 is a conceptual representation of the operations used to apply the thick mask model. The specific operations of the process 2000 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 2000 is performed by one or more software applications that execute on one or more computers.

Figure 21:
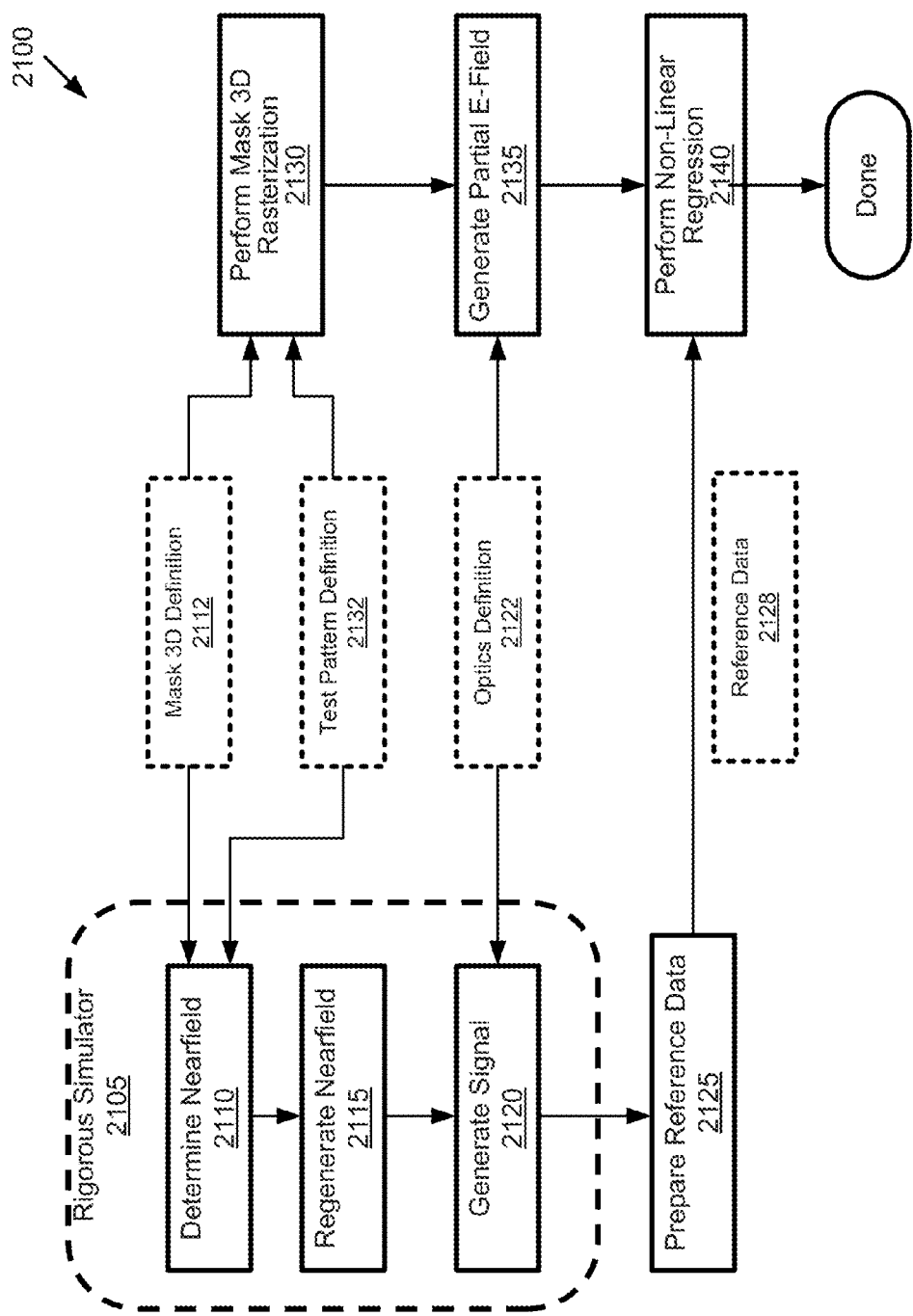
FIG. 21 is a flowchart of one embodiment of fitting scaling parameters for an off-axis illumination effective mask using rigorously simulated intensity signal as reference.

FIG. 21 is a flowchart of one embodiment of fitting scaling parameters for an off-axis illumination effective mask using rigorously simulated intensity signal as reference. Specifically, this figure describes a process 2100 that uses non-linear regression to solve for scaling parameters for the OAI effective mask. In one embodiment, the process 2100 starts before a thick mask model that addresses the OAI effective mask is applied, in one embodiment by the process described in FIG. 19 above. As shown in the figure, the process 2100 begins by determining, at block 2110, near-field based on a mask 3D definition 2112 and a test pattern definition 2132.

At block 2115, the process 2100 regenerates the near-field. At block 2120, the process 2100 generates signal based on an optics definition 2122. In one embodiment, optics definition 2122 includes a definition for the OAI effective mask. In one embodiment, blocks 2110, 2115, and 2120 are performed by a rigorous simulator 2105.

The process 2100, at block 2125, prepares reference data 2128. In one embodiment, the reference data 2128 are intensity signals for a set of sampling points.

At block 2130, the process 2100 performs mask 3D rasterization based on the mask 3D definition 2112 and the test pattern definition 2132. In one embodiment, the mask 3D rasterization produces a set of partial mask fields, $M_0$, $M_1$, $M_2$, $M_3$, $M_4$, etc., based on different polarization and polarity. In one embodiment, the mask field MF for the OAI effective mask can be represented as, $$MF = M_0 + M_1 * p_1 + M_2 * p_2 + M_3 * p_3 + M_4 * p_4 + \ldots$$

where $p_1$, $p_2$, $p_3$, and $p_4$ represent scaling parameters for the OAI effective mask.

At block 2135, the process 2100 generates partial electric field based on the optics definition. In one embodiment, the partial electric field is a convolution between the partial mask images and the optical kernels. In one embodiment, the partial electric field can be represented as, $$A_j = K_j \otimes M_0$$

$$B_j = K_j \otimes M_1$$

$$C_j = K_j \otimes M_2$$

$$D_j = K_j \otimes M_3$$

$$E_j = K_j \otimes M_4$$

where
$A_j$, $B_j$, $C_j$, $D_j$, and $E_j$ are partial electric fields, and
$K_j$ is an optical kernel.
Therefore, the total electric field $F_j$ can be represented as, $$F_j = A_j + p_1 B_j + p_2 C_j + p_3 D_j + p_4 E_j + \ldots$$

The intensity I of the OAI effective mask can be calculated by, $$I = \sum_j (K_j \otimes MF) \cdot (K_j \otimes MF)^* = \sum_j F_j \cdot F_j^*$$

wherein $F_j^*$ is the conjugate transpose of $F_j$.

Referring back to FIG. 21, at block 2140, the process 2100 performs non-linear regression to solve for the scaling parameters for the OAI effective mask. In one embodiment, the process 2100 performs non-linear regression to minimize a cost function regarding scaling parameters for the OAI effective mask based on the reference data 2128. The non-linear problem can be represented as, $$\text{Minimize: Cost} = \Sigma_i (I_i - S_i)^2 = f(p1, p2, p3, p4, \ldots)$$

where
i is the sampling point, and
S is the reference intensity signal.
The process 2100 then terminates.

One of ordinary skill in the art will recognize that the process 2100 is a conceptual representation of the operations used to apply the thick mask model. The specific operations of the process 2100 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 2100 is performed by one or more software applications that execute on one or more computers.

In one embodiment of the mask 3D OAI solution, mask 3D OAI effects are captured by few scaling factors (around 4-6 parameters). In one embodiment, the mask 3D OAI solution uses identical model form as normal incidence, i.e., incidence where perpendicular illumination is used. Downstream simulation for the mask 3D OAI solution has no speed penalty. In one embodiment, near-field collection can be reused and incrementally added. The signal-based parameter fitting flow, i.e., process 2100 described above, requests very limited specific process setting. Therefore, the mask 3D OAI solution is very efficient compared to conventional solutions for mask 3D OAI effect.

Figure 22:
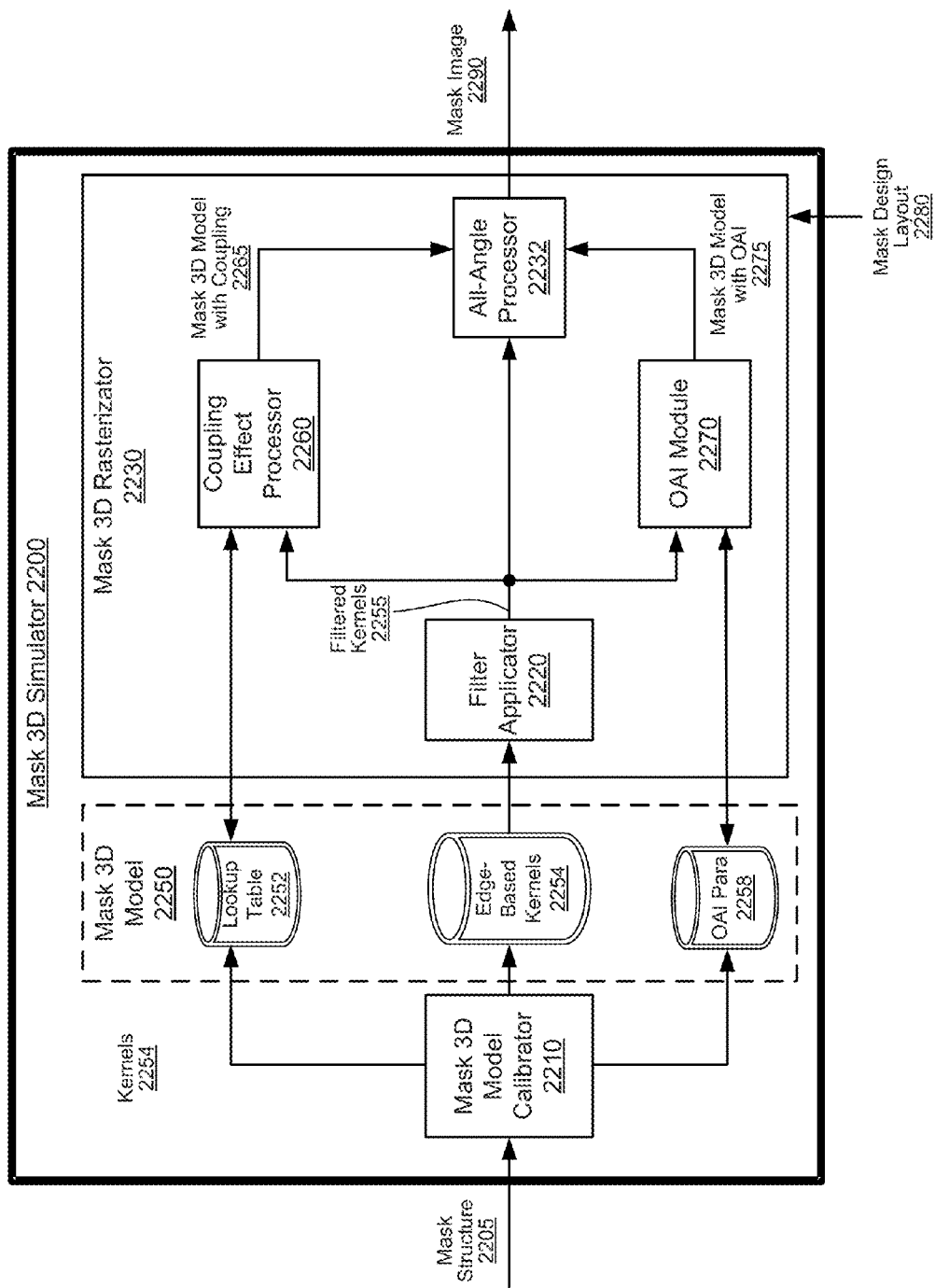
FIG. 22 conceptually illustrates one embodiment of a mask 3D simulator.

FIG. 22 conceptually illustrates one embodiment of a mask 3D simulator 2200. Specifically, the figure illustrates a set of components for performing the simulation of mask topography effect. In one embodiment, the mask 3D simulator 2200 is a stand-alone system, while in another embodiment the mask 3D simulator 2200 is part of a system for performing electronic design automation (EDA) operations. As shown in the figure, the mask 3D simulator 2200 includes a mask 3D model calibrator 2210 and a mask 3D rasterizator 2230. The mask 3D rasterizator 2230 includes a filter applicator 2220, a coupling effect processor 2260, an all-angle processor 2232, and an off-axis illumination module 2270.

The mask 3D model calibrator 2210 receives a mask topography structure 2205. Based on the mask topography structure 2205, the mask 3D model calibrator 2210 generates a mask 3D model 2250, which includes a lookup table 2252, edge-based kernels 2254, a rasterization filter (not shown), and OAI parameters 2258.

The lookup table 2252 stores scaling parameters for edge coupling effect. In one embodiment, the mask 3D model calibrator 2210 generates the lookup table 2252 through the process described in FIG. 15 above. The edge-based kernels 2254 can be applied to the edges in a mask design layout to produce mask 3D residual. In one embodiment, the mask 3D model calibrator 2210 generates the edge-based kernels 2254 through the process described in FIG. 3 above.

The OAI parameters 2258 stores scaling parameters for various OAI effective masks. In one embodiment, the mask 3D model calibrator 2210 generates the scaling parameters for the OAI parameters 2258 through processes described in FIGS. 20 and 21 above.

The mask 3D rasterizator 2230 receives a mask design layout 2280. In one embodiment, the mask design layout is in the form of a polygon-based hierarchical data file in the GDS (Graphic Database System) or OASIS.MASK format.

The rasterization filter can be applied to the edge-based kernels 2254 by filter applicator 2220 to improve the quality and efficiency of the edge-based kernels 2254. One embodiment of the rasterization filter is described in FIG. 8 above. The filter applicator 2220 receives the edge-based kernels 2254. The filter applicator 2220 applies the rasterization filter to the edge-based kernels 2254 and produces filtered kernels 2255.

The coupling effect processor 2260 receives the filtered kernels 2255 from the filter applicator 2220. The coupling effect processor 2260 retrieves scaling parameters from the lookup table 2252 and applies the scaling parameters to the filtered kernels 2255 to generate a mask 3D model with coupling effect 2265. In one embodiment, instead of receiving the filtered kernels 2255, the coupling effect processor 2260 receives the edge-based kernels 2254 and generates the mask 3D model with coupling effect 2265 based on the edge-based kernels 2254. The filter applicator 2220 then applies the rasterization filter to the mask 3D model with coupling effect 2265 to improve the quality and efficiency of the mask 3D model with coupling effect 2265.

The OAI module 2270 receives the filtered kernels 2255 from the filter applicator 2220. The OAI module 2260 retrieves scaling parameters from the OAI parameters 2258 and applies the scaling parameters to the filtered kernels 2255 to generate a mask 3D model with OAI 2275. In one embodiment, instead of receiving the filtered kernels 2255, the OAI module 2270 receives the edge-based kernels 2254 and generates the mask 3D model with OAI 2275 based on the edge-based kernels 2254. The filter applicator 2220 then applies the rasterization filter to the mask 3D model with OAI 2275 to improve the quality and efficiency of the mask 3D model with OAI 2275.

The all-angle processor 2232 deals with all-angle patterns in the mask design layout. One embodiment of the operations performed by the all-angle processor 2232 is described in FIG. 10 above. The all-angle processor 2232 receives the filtered kernels 2255 from the filter applicator 2220, and/or the mask 3D model with coupling effect 2265 from the coupling effect processor 2260, and/or the mask 3D model with OAI 2275 from the OAI module 2270. The mask 3D rasterizator 2230 rasterizes the mask design layout 2280 and produces a mask image 2290 as the output of the mask 3D simulator 2200.

The mask 3D simulator 2200 was described above for one embodiment of the invention. One of ordinary skill in the art will realize that in other embodiments this module can be implemented differently. For instance, in one embodiment described above, certain modules are implemented as software modules. However, in another embodiment, some or all of the modules of the mask 3D simulator 2200 might be implemented by hardware, which can be dedicated application specific hardware (e.g., an ASIC chip or component) or a general purpose chip (e.g., a microprocessor or FPGA).

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 23:
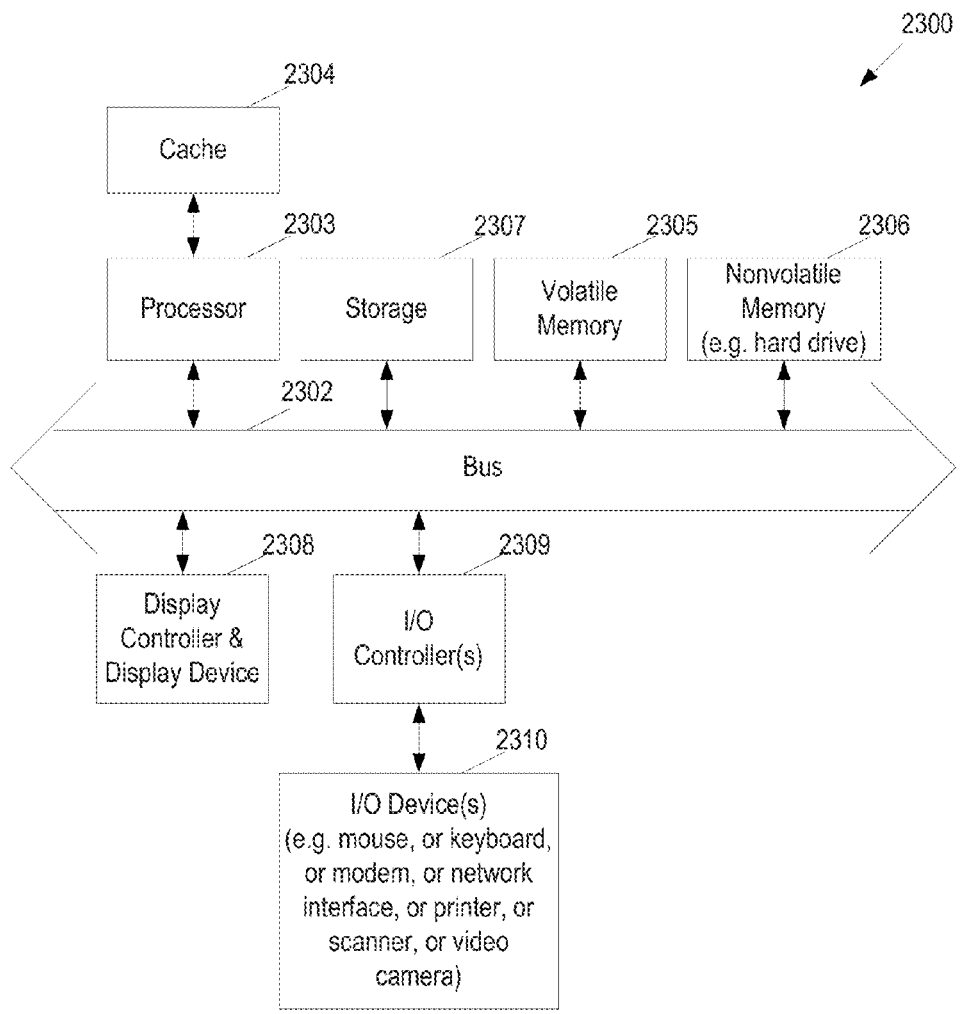
FIG. 23 shows one example of a typical computer system or data processing system that may be used with the disclosed embodiments.

FIG. 23 shows one example of a typical computer system or data processing system that may be used with the disclosed embodiments. For example, in one embodiment the processes described with respect to FIGS. 2-4, 14, 15, and 19-21 are operational through the example computing system. However, it is noted that while FIG. 23 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 23 may be any computing system capable of performing the described operations.

As shown in FIG. 23, the computer system 2300, which is a form of a data processing system, includes a bus 2302, which is coupled to one or more microprocessors 2303. In one embodiment, computer system 2300 includes one or more of a storage device (e.g., ROM) 2307, volatile memory (e.g., RAM) 2305, and a non-volatile memory (EEPROM, Flash) 2306. The microprocessor 2303 is coupled to cache memory 2304 as shown in the example of FIG. 23. Cache memory 2304 may be volatile or non-volatile memory.

The bus 2302 interconnects these various components together and in one embodiment interconnects these components 2303, 2307, 2305, and 2306 to a display controller and display device 2308. The computer system 2300 may further include peripheral devices such as input/output (I/O) devices, which may be mice, keyboards, modems, network interfaces, printers, scanners, video cameras and other devices which are well known in the art. Typically, the input/output devices 2310 are coupled to the system through input/output controllers 2309.

The volatile memory 2305 is typically implemented as dynamic RAM (DRAM) which requires power continually in order to refresh or maintain data in the memory. The non-volatile memory 2306 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 23 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 2302 may include one or more buses connected to each other through various bridges, controllers and/or adapters as is well known in the art. In one embodiment the I/O controller 2309 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 2-4, 14, 15, and 19-21 may be carried out in a computer system or other data processing system in response to its processor, such as a microprocessor, executing sequences of instructions contained in a memory, such as storage device 2307, volatile memory 2305, non-volatile memory 2306, cache 2304 or a remote storage device. In various embodiments, hardwired circuitry may be used in combination with software instructions to implement the disclosed embodiments. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 2303.

A machine readable storage medium can be used to store software and data which when executed by a data processing system causes the system to perform various methods of the disclosed embodiments. This executable software and data may be stored in various places including, for example, storage device 2307, volatile memory 2305, non-volatile memory 2306 and/or cache 2304 as shown in FIG. 23. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A computer-implemented method of performing mask topography effect modeling on a mask design layout, the method comprising:
    applying, using a computing device, a thin mask model to the mask design layout to create a thin mask transmission;
    applying a thick mask model to the mask design layout, the thick mask model comprising a plurality of edge-based kernels;
    applying a rasterization filter to the plurality of edge-based kernels to generate a plurality of filtered kernels, the applying of the thick mask model comprising applying the plurality of filtered kernels to edges in the mask design layout to produce a mask 3D residual; and
    combining the thin mask transmission and the mask 3D residual to create a mask 3D transmission, wherein the mask topography effect modeling on the mask design layout is used to create an improved optical mask for creating an integrated circuit.

2. The method of claim 1, wherein the plurality of edge-based kernels are for transverse electric (TE) polarization and transverse magnetic (TM) polarization.

3. The method of claim 1 further comprising generating the thick mask model.

4. The method of claim 3, wherein the generating of the thick mask model further comprises:
    receiving a mask topography structure;
    performing a rigorous simulation to simulate a near-field;
    generating a reference mask 3D residual by subtracting a thin mask electric field from the near-field; and
    deriving the plurality of edge-based kernels by decomposing the reference mask 3D residual.

5. The method of claim 4, wherein half-plane is used as a primitive in the reference mask 3D residual.

6. The method of claim 1, wherein the rasterization filter preserves high fidelity within an optical bandwidth, attenuates frequencies beyond a mirror point, and has a small spatial-domain ambit and angular symmetry.

7. The method of claim 1, wherein the applying of the plurality of filtered kernels to edges comprises:
    for each point on the edges, applying the plurality of filtered kernels to generate disturbance waves emitted by the point; and
    superposing the disturbance waves emitted by all points on the edges to produce the mask 3D residual.

8. The method of claim 1, wherein the applying of the thick mask model comprises applying the plurality of edge-based kernels to edges in the mask design layout to produce the mask 3D residual.

9. The method of claim 8, wherein one of the edges is an all-angle edge and the applying of the plurality of edge-based kernels to the all-angle edge further comprises:
    decomposing an incident electric field of the all-angle edge into a TE polarization component and a TM polarization component;
    applying corresponding edge-based kernels from the plurality of edge-based kernels to the TE polarization component and the TM polarization component to produce a mask 3D correction for the TE polarization component and a mask 3D correction for the TM polarization component; and
    combining the mask 3D correction for the TE polarization component and the mask 3D correction for the TM polarization component to form the mask 3D residual.

10. The method of claim 8, wherein the applying of the thick mask model further comprises generating a record that defines a set of relevant edges for each region in the mask design layout, and the applying of the plurality of edge-based kernels to edges further comprises, for each region in the mask design layout, applying the plurality of edge-based kernels only to the set of edges relevant to the region by checking the record, wherein an edge and a region is related when a point on the edge is within a pre-determined distance from the region.

11. A data processing system for performing mask topography effect modeling on a mask design layout, the data processing system comprising:
    means for applying a thin mask model to the mask design layout to create a thin mask transmission;
    means for applying a thick mask model comprising a plurality of edge-based kernels to the mask design layout;
    means for applying a rasterization filter to the plurality of edge-based kernels to generate a plurality of filtered kernels, wherein the applying of the thick mask model comprises applying the plurality of filtered kernels to edges in the mask design layout to produce a mask three-dimensional (3D) residual; and
    means for combining the thin mask transmission and the mask 3D residual to create a mask 3D transmission, wherein the mask topography effect modeling on the mask design layout is used to create an improved optical mask for creating an integrated circuit.

12. The data processing system of claim 11 further comprising:
    means for receiving a lookup table containing scaling parameters for edge coupling effects, each scaling parameter is indexed by associated geometry information,
    wherein the means for applying the thick mask model further comprises means for updating the plurality of edge-based kernels with the scaling parameters from the lookup table.

13. The data processing system of claim 12 further comprising means for generating the lookup table, wherein the means for generating the lookup table further comprises:
    means for collecting a plurality of near-field data for a plurality of periodic structures through rigorous simulation, different periodic structures have different feature width and space combinations;
    for each combination of feature width and space, means for calculating a set of scaling parameters by performing linear regression based on the plurality of filtered kernels and the near-field data related to a periodic structure corresponding to the combination of feature width and space; and
    means for storing the calculated scaling parameters into the lookup table.

14. The data processing system of claim 13, wherein the set of scaling parameters includes scaling factors for transverse electric (TE) polarization and transverse magnetic (TM) polarization.

15. The data processing system of claim 12, wherein the means for updating the plurality of edge-based kernels further comprises:
    means for determining edge segments and adjacent feature width and space for each edge segment;

for each edge segment, means for determining a set of scaling parameters corresponding to the feature width and space combination for the edge segment by looking up the lookup table;

for each edge segment, means for updating the plurality of edge-based kernels by applying the set of scaling parameters determined for the edge segment; and for each edge segment, means for applying the plurality of updated kernels to reflect edge coupling effect.

16. The data processing system of claim 15, wherein the means for determining the adjacent feature width and space for each edge segment comprises means for performing a vertical scan and a horizontal scan using a scanline algorithm.

17. A computer program product stored as program code on a non-transitory computer-readable medium, the program code executable by at least one processor for performing mask topography effect modeling on a mask design layout, the computer program product comprising a computer readable program code comprising instructions for:

applying a thin mask model to the mask design layout to create a thin mask transmission;

applying a thick mask model comprising a plurality of edge-based kernels to the mask design layout;

applying a rasterization filter to the plurality of edge-based kernels to generate a plurality of filtered kernels, wherein the applying of the thick mask model comprises applying the plurality of filtered kernels to edges in the mask design layout to produce a mask three-dimensional (3D) residual; and combining the thin mask transmission and the mask 3D residual to create a mask 3D transmission, wherein the mask topography effect modeling on the mask design layout is used to create an improved optical mask for creating an integrated circuit.

18. The computer program product of claim 17, wherein the computer readable program code further comprises instructions for receiving a set of scaling parameters for off-axis illumination (OAI) effective masks, wherein the instructions for applying the thick mask model comprise instructions for updating the plurality of edge-based kernels with the set of scaling parameters.

19. The computer program product of claim 18, wherein the computer readable program code further comprises instructions for generating the thick mask model, wherein the instructions for generating the thick mask model further comprises instructions for:

receiving a mask topography structure;

performing a rigorous simulation to simulate a near-field;

generating a reference mask 3D residual by subtracting a thin mask electric field from the near-field; and deriving the plurality of edge-based kernels by decomposing the reference mask 3D residual.

20. The computer program product of claim 18, wherein the computer readable program code further comprises instructions for computing the set of scaling parameters for the OAI effective masks.

21. The computer program product of claim 20, wherein the instructions for computing the set of scaling parameters comprises instructions for:

determining a reference critical dimension (CD) of the OAI effective mask;

receiving the set of scaling parameters with initially assigned values;

determining a CD of the OAI effective mask based on a result of the mask rasterization, wherein the mask rasterization is performed by applying the set of scaling parameters to corresponding kernels;

determining whether a difference between the CD and the reference CD is less than a pre-determined CD threshold; and when the difference is not less than the pre-determined CD threshold, updating the set of scaling parameters.

22. The computer program product of claim 21, wherein the reference CD is determined through rigorous simulation.

23. The computer program product of claim 21, wherein the reference CD is determined through measuring wafer CD.

24. The computer program product of claim 20, wherein the instructions for computing the set of scaling parameters comprises instructions for:

determining a plurality of reference intensity signals for a plurality of sampling points through rigorous simulation;

generating a set of partial electric fields based on the plurality of convolution kernels and a plurality of optics kernels for the plurality of sampling points; and extracting the set of scaling parameters based on the set of reference intensity signals and the set of partial electric fields by performing a non-linear regression to minimize a function about the set of scaling parameters.

25. The computer program product of claim 24, wherein the plurality of reference intensity signals is determined based on a mask 3D definition and a test pattern definition.

* * * * *